United States Patent
Oh et al.

(10) Patent No.: US 7,298,667 B2
(45) Date of Patent: *Nov. 20, 2007

(54) LATENCY CONTROL CIRCUIT AND METHOD OF LATENCY CONTROL

(75) Inventors: Reum Oh, Seoul (KR); Sang-bo Lee, Yongin (KR); Moo-sung Chae, Seoul (KR); Ho-young Song, Yongin (KR)

(73) Assignee: Samsung Electronic Co., Ltd., Kyunggi-Do (KR)

( * ) Notice: Subject to any disclaimer, the term of this patent is extended or adjusted under 35 U.S.C. 154(b) by 19 days.

This patent is subject to a terminal disclaimer.

(21) Appl. No.: 11/202,314

(22) Filed: Aug. 12, 2005

(65) Prior Publication Data

US 2006/0077751 A1   Apr. 13, 2006

Related U.S. Application Data

(63) Continuation-in-part of application No. 10/727,579, filed on Dec. 5, 2003, now Pat. No. 6,944,091, which is a continuation-in-part of application No. 10/283,124, filed on Oct. 30, 2002, now Pat. No. 6,707,759.

(30) Foreign Application Priority Data

| Jul. 10, 2002 | (KR) | .................. 10-2002-0040094 |
| Jun. 9, 2003 | (KR) | .................. 10-2003-0036747 |
| Jan. 5, 2005 | (KR) | .................. 10-2005-0000812 |

(51) Int. Cl.
*G11C 8/00* (2006.01)
(52) U.S. Cl. .................. 365/233; 365/189.05; 365/194
(58) Field of Classification Search ................ 365/233, 365/189.05, 194
See application file for complete search history.

(56) References Cited

U.S. PATENT DOCUMENTS

| 5,614,855 | A | 3/1997 | Lee et al. |
| 6,570,814 | B2 | 5/2003 | Farmwald et al. |
| 6,615,307 | B1 | 9/2003 | Roohparvar |
| 6,707,759 | B2 * | 3/2004 | Song .................... 365/233 |

FOREIGN PATENT DOCUMENTS

| JP | 2002-074961 | 3/2002 |
| KR | 10-0378191 | 3/2003 |
| KR | 10-2004-0005517 | 1/2004 |

* cited by examiner

*Primary Examiner*—Huan Hoang
(74) *Attorney, Agent, or Firm*—Harness, Dickey & Pierce, P.L.C.

(57) ABSTRACT

In one embodiment, a latency circuit generates the latency signal based on CAS latency information and read information. For example, the latency circuit may include a clock signal generating circuit generating a plurality of transfer signals and generating a plurality of sampling clock signals based on and corresponding to the plurality of transfer signals such that a timing relationship is created between the transfer signals and the sampling clock signals. The latency circuit may further include a latency signal generator selectively storing the read information based on the sampling clock signals, and selectively outputting the stored read information as the latency signal based on the transfer signals. The latency signal generator may also delay the read information such that the delayed, read information is stored based on the sampling clock signals.

50 Claims, 31 Drawing Sheets

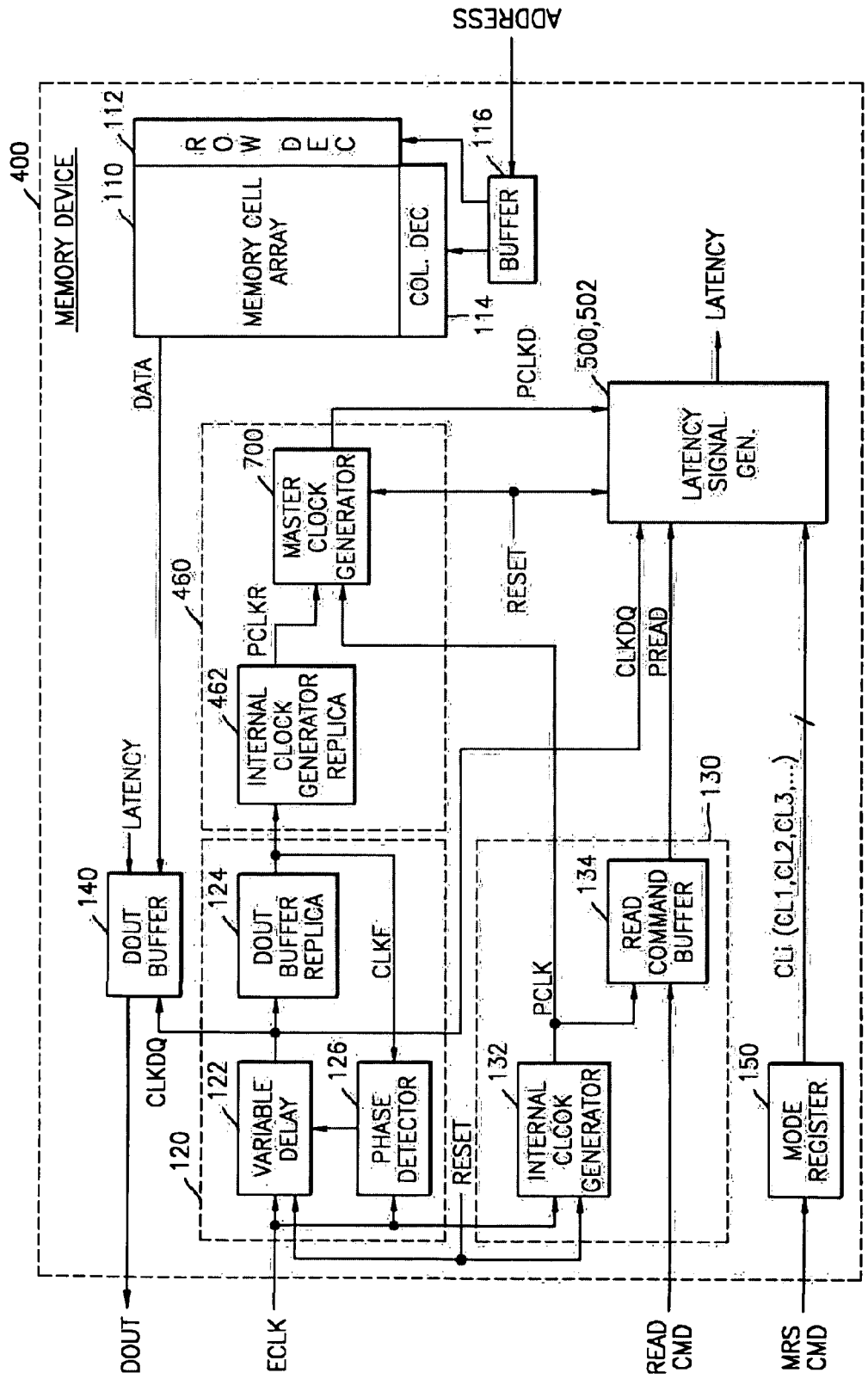

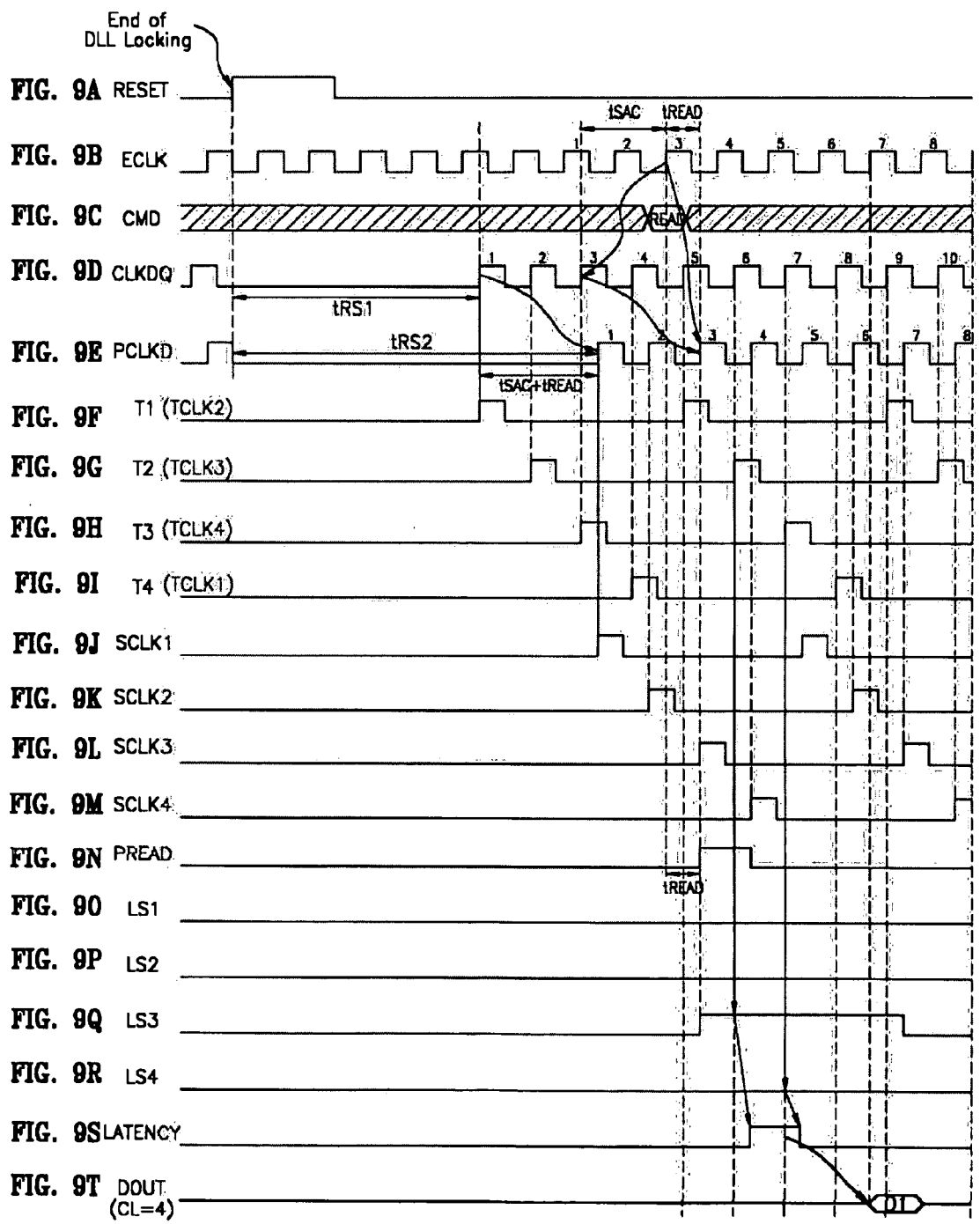

FIG. 10B

| CL MODE | TCLK1 | TCLK2 | TCLK3 | TCLK4 |
|---|---|---|---|---|
| 4 | T4 | T1 | T2 | T3 |
| 5 | T1 | T2 | T3 | T4 |
| 2 | T2 | T3 | T4 | T1 |
| 3 | T3 | T4 | T1 | T2 |

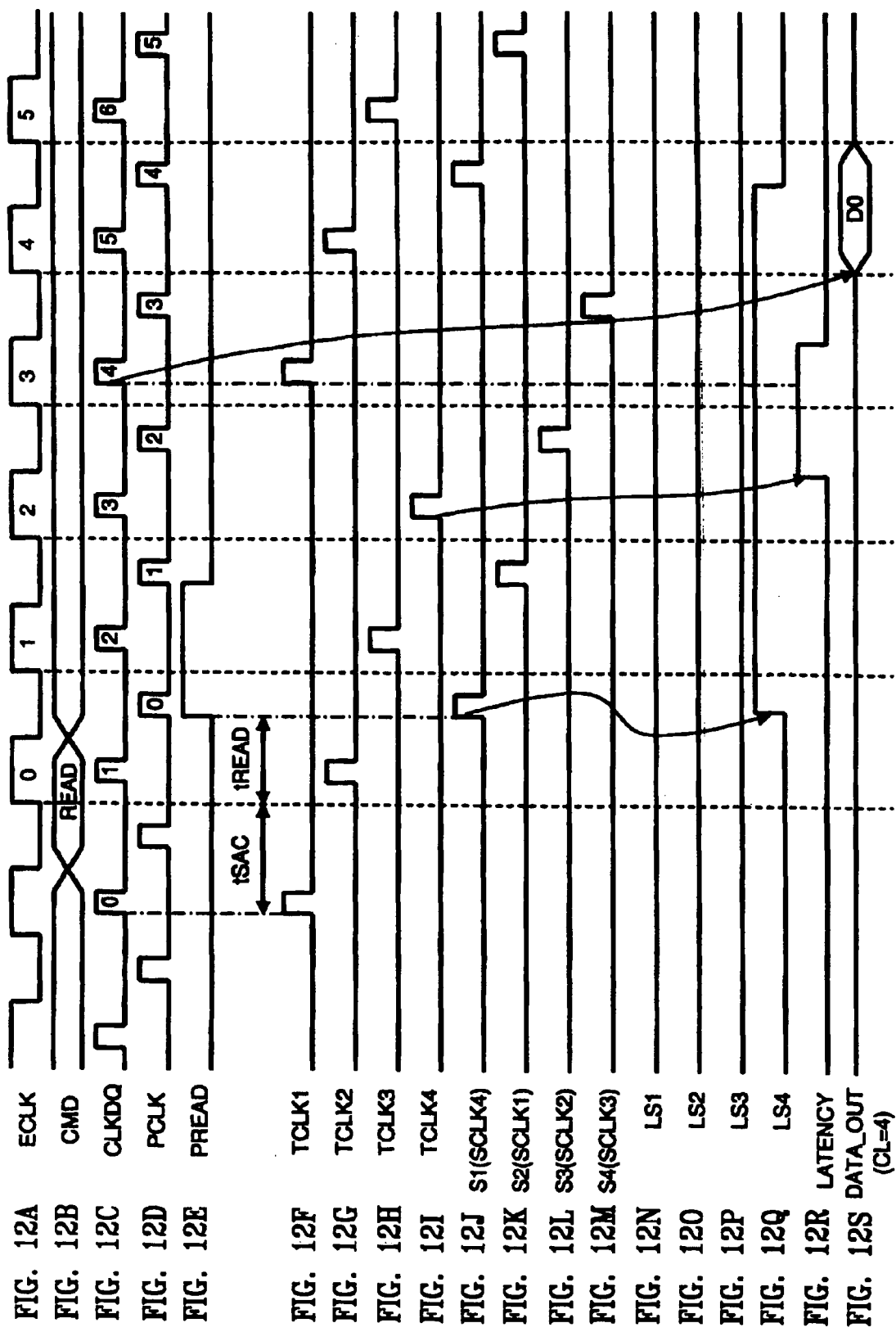

FIG. 13B

| CL | SCLK1 | SCLK2 | SCLK3 | SCLK4 |
|---|---|---|---|---|
| 2 | S4 | S1 | S2 | S3 |
| 3 | S3 | S4 | S1 | S2 |
| 4 | S2 | S3 | S4 | S1 |
| 5 | S1 | S2 | S3 | S4 |

FIG. 16

| CL2 | | | | | | ~ | 1 | 1 | 1 | 1 | 1 | 1 |
|---|---|---|---|---|---|---|---|---|---|---|---|---|
| TCLK1 | 0 | | | | | | 1 | 0 | 0 | 0 | 0 | 0 |
| TCLK2 | 0 | | | | | | 0 | 0 | 0 | 0 | 0 | 0 |
| TCLK3 | 0 | | | | | | 0 | 0 | 0 | 0 | 0 | 0 |
| TCLK4 | 0 | | | | | | 0 | 0 | 0 | 0 | 0 | 0 |

| CL3 | | | | | | ~ | 1 | 0 | 0 | 0 | 0 | 0 |
|---|---|---|---|---|---|---|---|---|---|---|---|---|
| TCLK1 | 0 | | | | | | 0 | 1 | 1 | 1 | 0 | 1 |
| TCLK2 | 0 | | | | | | 0 | 0 | 0 | 0 | 0 | 0 |
| TCLK3 | 0 | | | | | | 0 | 0 | 0 | 0 | 0 | 0 |
| TCLK4 | 0 | | | | | | 0 | 0 | 0 | 0 | 0 | 0 |

| CL4 | | | | | | ~ | 1 | 0 | 0 | 1 | 0 | 0 |
|---|---|---|---|---|---|---|---|---|---|---|---|---|
| TCLK1 | 0 | | | | | | 0 | 1 | 0 | 0 | 1 | 0 |
| TCLK2 | 0 | | | | | | 0 | 0 | 1 | 0 | 0 | 1 |
| TCLK3 | 0 | | | | | | 0 | 1 | 0 | 0 | 0 | 0 |
| TCLK4 | 0 | | | | | | 0 | 0 | 0 | 0 | 0 | 0 |

| CL5 | | | | | | ~ | 1 | 0 | 0 | 0 | 1 | 0 |
|---|---|---|---|---|---|---|---|---|---|---|---|---|
| TCLK1 | 0 | | | | | | 0 | 1 | 0 | 1 | 0 | 0 |
| TCLK2 | 0 | | | | | | 0 | 0 | 1 | 0 | 0 | 0 |
| TCLK3 | 0 | | | | | | 0 | 0 | 0 | 1 | 0 | 0 |
| TCLK4 | 0 | | | | | | 0 | 0 | 0 | 0 | 0 | 0 |

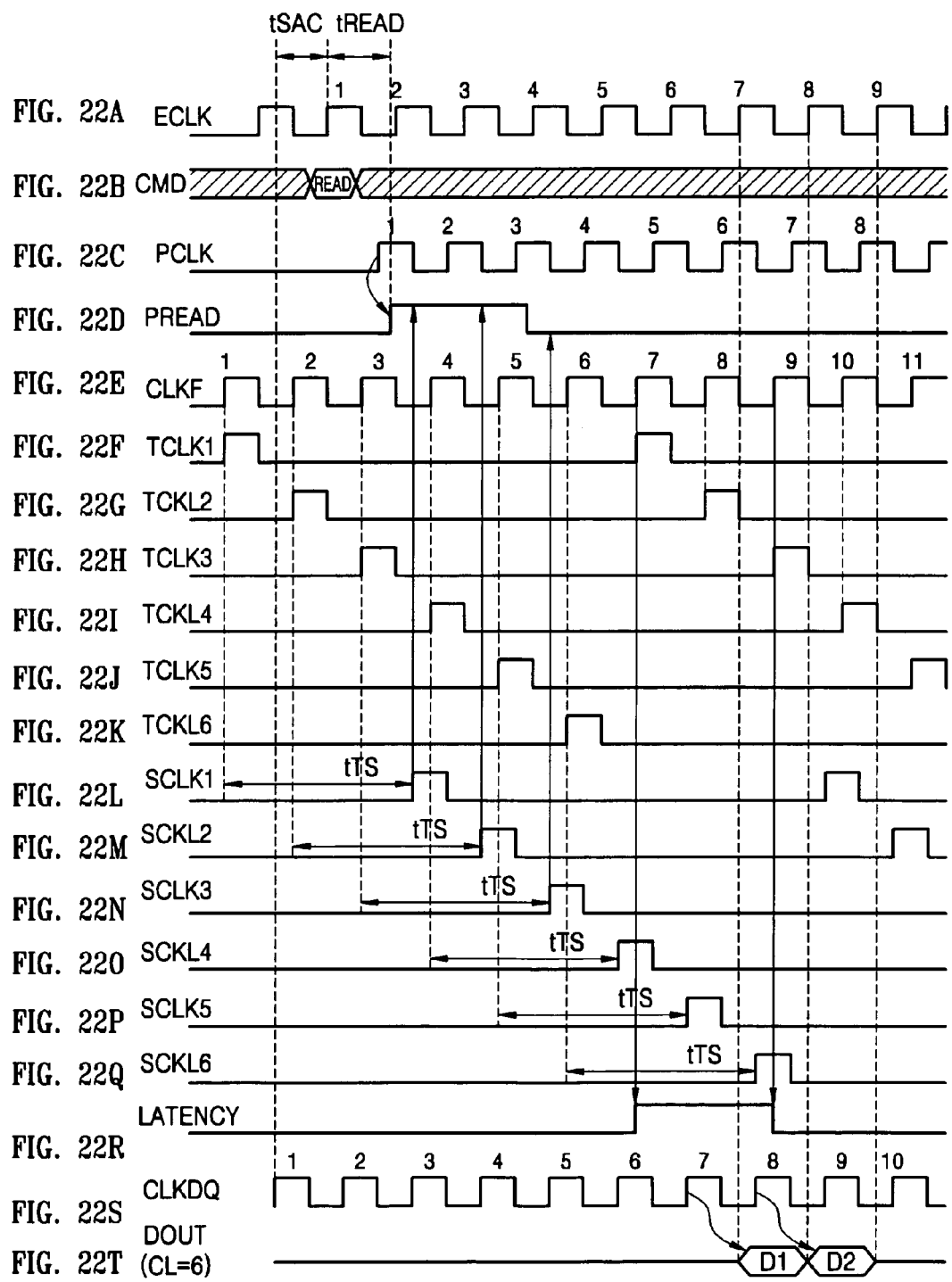

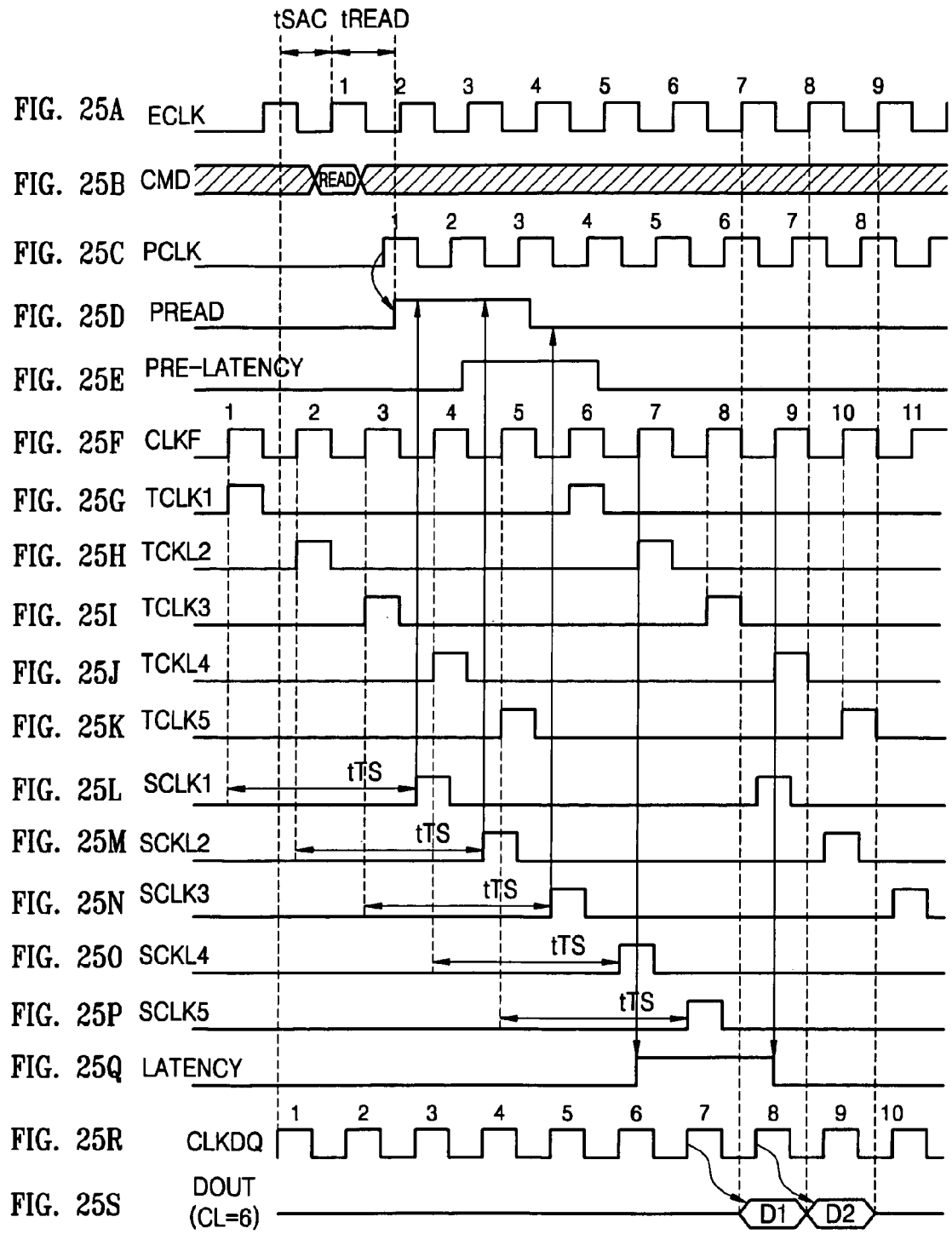

LATENCY CONTROL CIRCUIT AND METHOD OF LATENCY CONTROL

DOMESTIC PRIORITY INFORMATION

This is a continuation-in-part of application Ser. No. 10/727,579, filed Dec. 5, 2003, now U.S. Pat. No. 6,944,091; which is a continuation-in-part of application Ser. No. 10/283,124 filed Oct. 30, 2002, now U.S. Pat. No. 6,707,759; the contents of both of which are hereby incorporated by reference in their entirety.

FOREIGN PRIORITY INFORMATION

This application claims priority on Korean Application No. 10-2002-0040094, filed Jul. 10, 2002, Korean Application No. 10-2003-0036747, filed Jun. 9, 2003, and Korean Application No. 10-2005-0000812, filed Jan. 5, 2005; the contents of each of which are hereby incorporated by reference in their entirety.

BACKGROUND OF THE INVENTION

FIG. 1 illustrates a block diagram of a prior art memory device. The memory device 100 includes a memory cell array 110, a clock synchronizing circuit block 120, a read command path block 130, a data output buffer 140, a mode register 150 and a latency circuit 160. In operation, data is written into the memory cell array 110 and read out from the memory cell array 110. If a read command is asserted to the memory device 100, data is read out from the memory cell array 110 according to an externally received address. A buffer 116 receives and temporarily stores the address. A row decoder 112 receives the stored address and decodes a row address of the memory cell array 110 from the address. A column decoder 114 receives the stored address and decodes a column address of the memory cell array 110 from the address. The memory cell array 110 outputs the data addressed by the row and column addresses. The data output buffer 140 receives the data output from the memory cell array 110, and outputs the data based on a latency signal from the latency circuit 160 and an internal data output clock signal CLKDQ.

The clock synchronizing circuit block 120 generates the data output clock signal CLKDQ based on an external clock signal ECLK. The external clock signal ECLK serves as a reference clock signal for most commands of the memory device 100. Specifically, most commands are asserted to the memory device 100 in synchronization with the external clock signal ECLK. As shown in FIG. 1, the clock synchronizing circuit block 120 is a delay locked loop (DLL) circuit. The DLL circuit 120 includes a variable delay 122, a data output buffer replica 124 and a phase detector 126. The DLL circuit 120 is a well known circuit such as described in U.S. Pat. No. 5,614,855; and therefore, will not be described in detail. The DLL circuit 120 generates the data output clock signal CLKDQ as a phase lead version of the external clock ECLK. Namely, the data output clock signal CLKDQ has the same frequency as the external clock ECLK, but the pulses of the data output clock signal CLKDQ precede the pulses of the external clock signal ECLK by a data output time tSAC. The data output time is a measurement of the time it takes the data output buffer 140 to output data. Accordingly, the DLL circuit 120 causes data to be output from the data output buffer 140 in synchronization with the external clock ECLK.

The read command path block 130 receives the read command and the external clock signal ECLK. An internal clock generator 132 receives the external clock signal ECLK and generates an internal clock signal PCLK from the external clock signal ECLK. Specifically, the internal clock signal PCLK is a buffered version of the external clock signal ECLK. Therefore, the internal clock signal PCLK has the same frequency as the external clock signal ECLK and the level of the internal clock signal PCLK swing is a CMOS level (VSS-VCC) buffered signal delayed from the external clock signal ECLK. The internal clock signal PCLK is used to control peripheral circuits (not shown) such as data sense amplifiers, data multiplexers, etc., in the memory device 100. A read command buffer 134 in the read command path block 130 receives the read command and the internal clock signal PCLK. The read command buffer 134 inputs the read command synchronized with the internal clock signal PCLK, and outputs an internal read signal PREAD, which is supplied to the latency circuit 160.

The memory device 100 has several modes of operation. The mode register 150 stores a mode register set (MRS) command asserted to the memory device 100. The MRS command indicates the mode of the memory device 100. CAS latency information is determined by the MRS command. The CAS latency information indicates the CAS latency mode, which is the number of clock cycles of the external clock signal ECLK that should occur between the receipt of a read command or column address until data is output by the memory device 100. Stated another way, data is output from the memory device in a CAS latency number of clock cycles after receipt of the read command (a column address being asserted together with the read command).

The latency circuit 160 receives the CAS latency information from the mode register 150 and generates a latency signal such that the data output buffer 140 is enabled to output the data according to the desired CAS latency. More specifically, the data output buffer 140 outputs the stored data in response to the data output clock signal CLKDQ while the latency signal is enabled.

FIG. 2 illustrates a prior art latency circuit 160. As shown, the latency circuit 160 includes first, second and third D-flip flops 215, 225 and 235 connected in cascade. Each D-flip flop receives the data output clock signal CLKDQ at its clock input. The internal read signal PREAD is supplied to the D input of the first D-flip flop 215. The internal read signal PREAD and Q output of each of the first-third D-flip flops 215, 225 and 235 are respectively connected to first-fourth switches 210, 220, 230 and 240. The first-fourth switches 210, 220, 230 and 240 are respectively controlled by a CAS latency indicator CL1, CL2, CL3 and CL4 decoded from the CAS latency information. Namely, the CAS latency information is N bits that indicate the CAS latency mode. The N bits are decoded by a simple logic decoder (not shown) to produce the CAS latency indicators CL1-CL4 associated with each CAS latency mode. As will be appreciated, the CAS latency indicator for the activated CAS latency mode will be, for example, logic high, while the other CAS latency indicators will be logic low. The output of the first-fourth switches 210, 220, 230 and 240 serve as the latency signal. In operation, only one of the CAS latency modes will be logic high; therefore, only one of the first-fourth switches 210, 220, 230 and 240 will transfer a signal for output as the latency signal. For example, when the CAS latency is 1, CL1 is logic high and turns on first switch 210. At this time, the other CAS latency indicators CL2, CL3, and CL4 are logic low. The internal read signal is then transferred as the latency signal via the first switch 210. When the CAS latency is two (i.e., CL equals 2), then CL2 is logic high, while CL1, CL3 and CL4 are logic low. Thus, the internal read signal PREAD is transferred as the latency signal via the first D-flip flop 215 and the second switch 220. The first D-flip flop 215 is triggered by the data output clock signal CLKDQ and delays the internal read signal PREAD being output as the latency signal by about one clock cycle. The operation when the CAS latency is three or four is similar to that discussed above with respect to the CAS latency of two, and therefore will not be repeated for the sake of brevity. Additionally, it will be understood that CAS latencies greater than four could be handled by the addition of more D-flip flops and switches.

FIG. 3A illustrates a timing diagram of the read operation when the CAS latency is 1. At a clock cycle C0, a read command 310 is asserted, and an internal read signal PREAD is generated by the read command path block 130 after an internal delay time tREAD. The latency signal is then enabled in response to the internal read signal PREAD as discussed above with respect to FIG. 2. As further shown in FIG. 3A, the DLL circuit 120 generates the data output clock signal CLKDQ such that the rising edge of the data output clock signal CLKDQ precedes the rising edge of the external clock signal ECLK by a period of time tSAC, where the time period tSAC equals the delay between enabling data output from the data output buffer 140 and the actual output of data from the memory device 100. As further discussed above with respect to FIG. 1, the data output buffer 140 outputs data when triggered by the data output clock signal CLKDQ only when the latency signal is enabled. Because the CAS latency has been set to 1 in this example, the latency signal is enabled prior to receipt of the data output clock signal CLKDQ. As a result, data is output from the memory device 100 in synchronization with the first clock pulse C1 of the external clock signal ECLK following the clock pulse C0 of the external clock signal ECLK when the read command 310 was received. The time delays tREAD and tSAC are internal delays set according to current process technology. Minimizing these delays improves the timing margin as to when the latency signal must be enabled before receipt of the data output clock signal CLKDQ. As the frequency of operation increases (i.e., the frequency of the external clock signal ECLK increases), the period between clock pulses of the external clock signal ECLK decreases. This reduces the timing margin for supplying the latency signal. Consequently, above a certain operating frequency, the latency signal enables after the data output clock signal CLKDQ, and the data is no longer output at the desired CAS latency. This results in a data read operation failure.

FIG. 3B illustrates another example of where the operation frequency is low enough such that a proper data read operation takes place for a CAS latency of 2. However, FIG. 3C shows the operation of the memory device 100 during a high frequency operation, wherein a data read operation failure takes place. As shown in this example, tREAD plus tSAC is greater than the period tCC of the external clock signal ECLK such that the internal read signal PREAD is asserted after the rising edge of a pulse CDQ1 of the data output clock signal CLKDQ. The latency signal thus becomes enabled after a pulse CDQ4 of the data output clock signal CLKDQ for the desired CAS latency. In the example of FIG. 3C, the desired CAS latency is 4, and as is shown, data is output according to a CAS latency of 5 instead of a CAS latency of 4. As a result, a data read operation failure takes place.

SUMMARY OF THE INVENTION

The memory device according to the present invention includes a memory cell array from which data is read. Read data is stored in an output buffer, which outputs data based on a latency signal generated in accordance with the desired CAS latency of the memory device. The memory device includes a latency circuit that permits a desired CAS latency of the memory device to be achieved without read operation error even when the memory device is operating at high frequency.

More specifically, in one embodiment the latency circuit selectively associates at least one transfer signal with at least one sampling signal based on the desired CAS latency to create a desired timing relationship between the associated sampling and transfer signals. Read information is stored by the latency circuit in accordance with at least one of the sampling signals, and the latency signal is generated based on the transfer signal associated with the sampling signal used in storing the read information.

The arrangement and methodology of the latency circuit in at least one embodiment the present invention allows for pointing or identifying a point in time as to when the memory cell array of the memory device is being read, and for pointing or identifying a point in time when to generate the latency signal with respect to the first pointer. By establishing the relationship between the first and second pointers based on the desired CAS latency, a read operation according to the desired CAS latency is achieved.

In one embodiment, the latency circuit generates the latency signal based on CAS latency information and read information. For example, the latency circuit may include a clock signal generating circuit generating a plurality of transfer signals and generating a plurality of sampling clock signals based on and corresponding to the plurality of transfer signals such that a timing relationship is created between the transfer signals and the sampling clock signals. The latency circuit may further include a latency signal generator selectively storing the read information based on the sampling clock signals, and selectively outputting the stored read information as the latency signal based on the transfer signals.

In another embodiment, the latency circuit generates a plurality of transfer signals and a plurality of sampling clock signals such that a timing relationship is created between the transfer signals and the sampling clock signals, delays the read information, selectively stores the delayed read information based on the sampling clock signals, and selectively outputs the stored, delayed read information as the latency signal based on the transfer signals.

BRIEF DESCRIPTION OF THE DRAWINGS

The present invention will become more fully understood from the detailed description given below and the accompanying drawings, wherein like elements are represented by like reference numerals, which are given by way of illustration only and thus are not limitative of the present invention and wherein:

FIGS. 4A-4C illustrate exemplary embodiments of the memory device according to the present invention;

FIGS. 9A-9T illustrate the waveforms of the signals generated by or received by the memory device of FIG. 4A, 4B or 4C having a latency signal generator as illustrated in FIG. 5;

FIG. 10B illustrates the mapping of transfer signals to output transfer clock signals for the embodiment of the multiplexers illustrated in FIG. 10A;

FIGS. 12A-12S illustrate the waveforms of the signals generated by or received by the memory device of FIG. 4A, 4B or 4C having a latency signal generator as illustrated in FIG. 11;

FIG. 13B illustrates the mapping of sampling signals to output sampling clock signals for the embodiment of the multiplexers illustrated in FIG. 13A;

FIG. 16 illustrates tables for CAS latency modes two-five that demonstrate which of the first-fourth transfer clock signals TCLK1-TCLK4 and which of the first-fourth sampling clock signals SCLK1-SCLK4 become active for each CAS latency mode in the embodiment of FIG. 15;

FIGS. 22A-22T illustrate waveforms of the signals generated by or received by the memory devices of FIG. 1, 4A, 4B or 4C having a latency circuit as illustrated in FIG. 20 when the CAS latency is 6;

FIGS. 25A-25S illustrate waveforms of the signals generated by or received by the memory device of FIG. 1, 4A, 4B or 4C having a latency circuit as illustrated in FIG. 23 when the CAS latency is 6.

DETAILED DESCRIPTION OF THE EMBODIMENTS

Figure 4A:
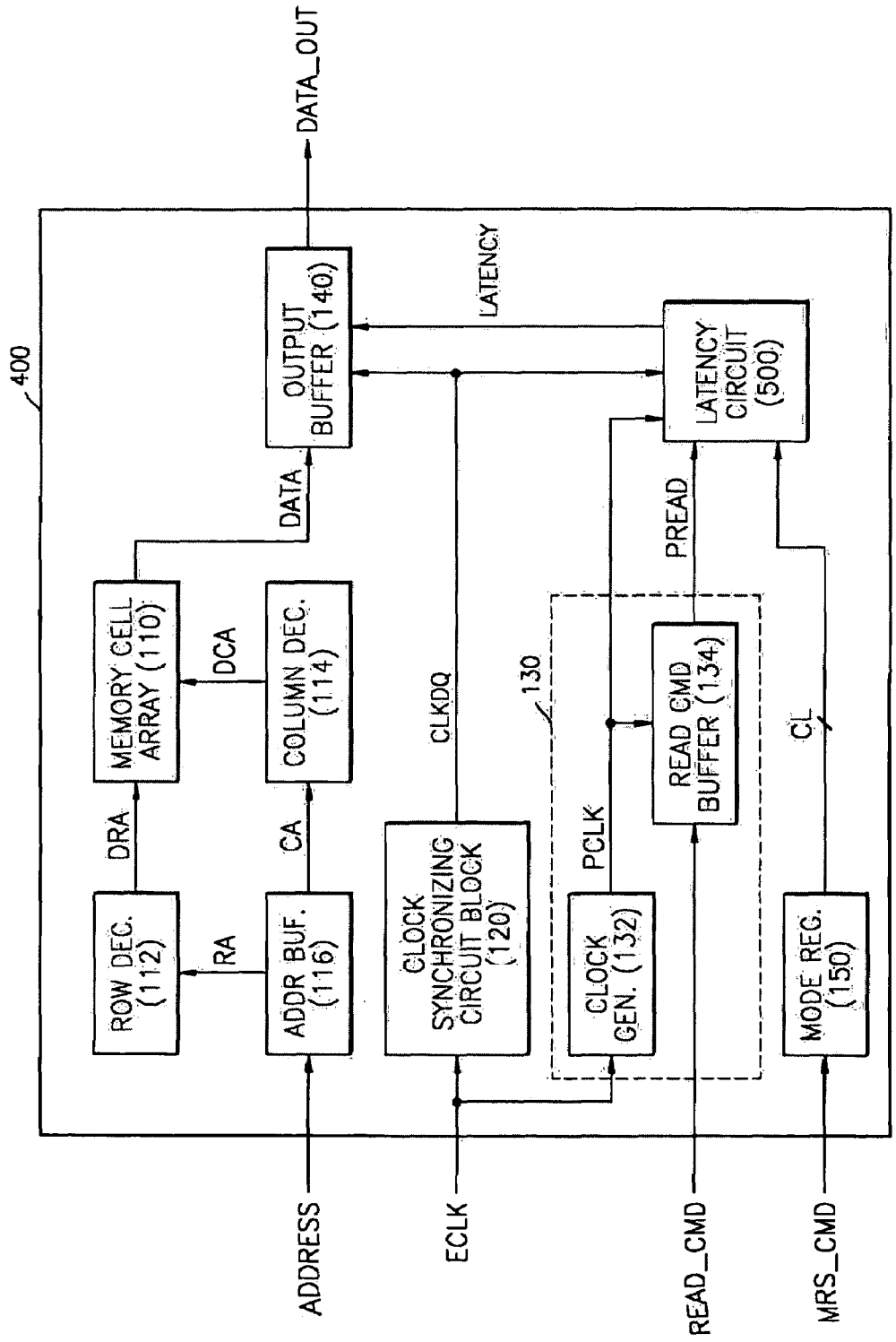

FIG. 4A illustrates an embodiment of the memory device according to the present invention. As shown, the memory device 400 includes a memory cell array 110, a clock synchronizing circuit block 120, a read command path block 130, a data output buffer 140, a mode register 150, and a latency circuit 500. Like reference numerals have been used to designate like components between the memory device 400 and the prior art memory device 100 described in the Background of the Invention section. Accordingly, a description of these same components will not be repeated for the sake of brevity.

Figure 4B:
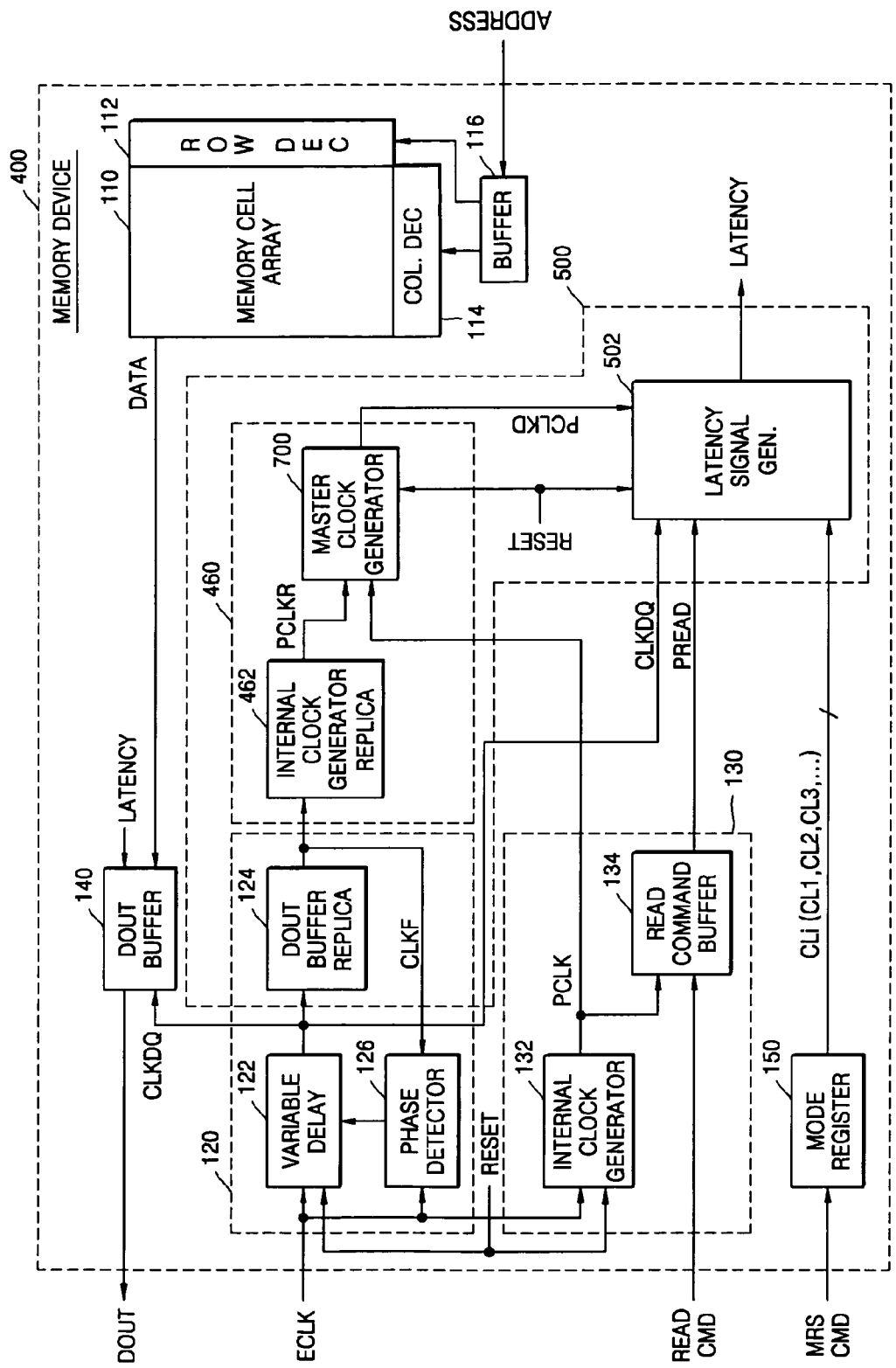

FIG. 4B illustrates one embodiment of the latency circuit 500 in greater detail. As shown, the latency circuit 500 includes a latency signal generator 502 generating the latency signal based on the data output clock CLKDQ, a master clock signal PCLKD, the internal read signal PREAD, and the CAS latency information. A read command path block replica 460 in the latency circuit 500 generates the master clock signal PCLKD based on a buffered version of the data output clock signal CLKDQ, which is generated by the data output buffer replica 124 in the clock synchronizing circuit block 120. As such, the latency circuit 500 has been illustrated as sharing the data output buffer replica 124 with the clock synchronizing circuit block 120. The operation of the read command path block replica 460 and the latency signal generator 502 will described in greater detail below after the discussion of a second embodiment of the latency circuit 500.

FIG. 4C illustrates a second embodiment of the latency circuit 500. In this embodiment, the latency circuit 500 does not include the data output buffer replica 124 or the read command path block replica 460. Instead, as shown in FIG. 4C, these elements are external to the latency circuit 500.

Next, the read command path block replica 460 and the latency signal generator 502 will be described in detail.

The read command path block replica 460 includes an internal clock generator replica 462 that receives a buffered version of the data output clock signal CLKDQ from the data output buffer replica 124. The data output buffer replica 124 replicates the output delay of the data output buffer 140. Accordingly, the buffered clock signal CLKF is a delayed version of the data output clock signal CLKDQ. The internal clock generator replica 462 is a replica of the internal clock generator 132, and generates a replica internal clock signal PCLKR. A master clock generator 700 receives the internal clock signal PCLK and the replica internal clock signal PCLKR and generates a master clock signal PCLKD.

Figure 7:
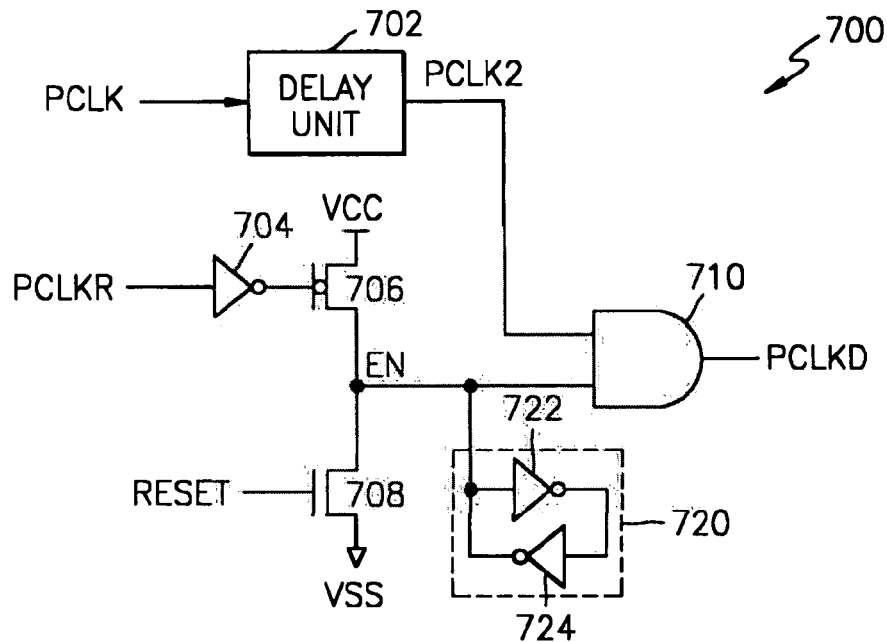
FIG. 7 illustrates an embodiment of the master clock generator in FIGS. 4A-4C.

FIG. 7 illustrates an embodiment of the master clock generator 700. As shown, an inverter 704 receives the replica internal clock signal PCLKR. The output of the inverter 704 controls the operation of a PMOS transistor 706, which is connected in series with an NMOS transistor 708 between a power supply voltage VCC and a reference or ground voltage VSS. The operation of the NMOS transistor 708 is controlled by a reset signal. An enable signal is generated at the node connecting the PMOS transistor 706 and the NMOS transistor 708. This enable signal is latched by a latch 720, which is comprised of inverters 722 and 724 connected in a loop configuration to the enable signal node EN. An AND gate 710 receives the enable signal and a delayed internal clock signal PCLK2. A delay unit 702 receives and delays the internal clock signal PCLK to generate the delayed internal clock signal PCLK2. The period of the delay substantially equals the period of time to generate the enable signal based on the replica internal clock signal PCLKR. The output of the AND gate 710 serves as the master clock signal PCLKD.

Figure 8:
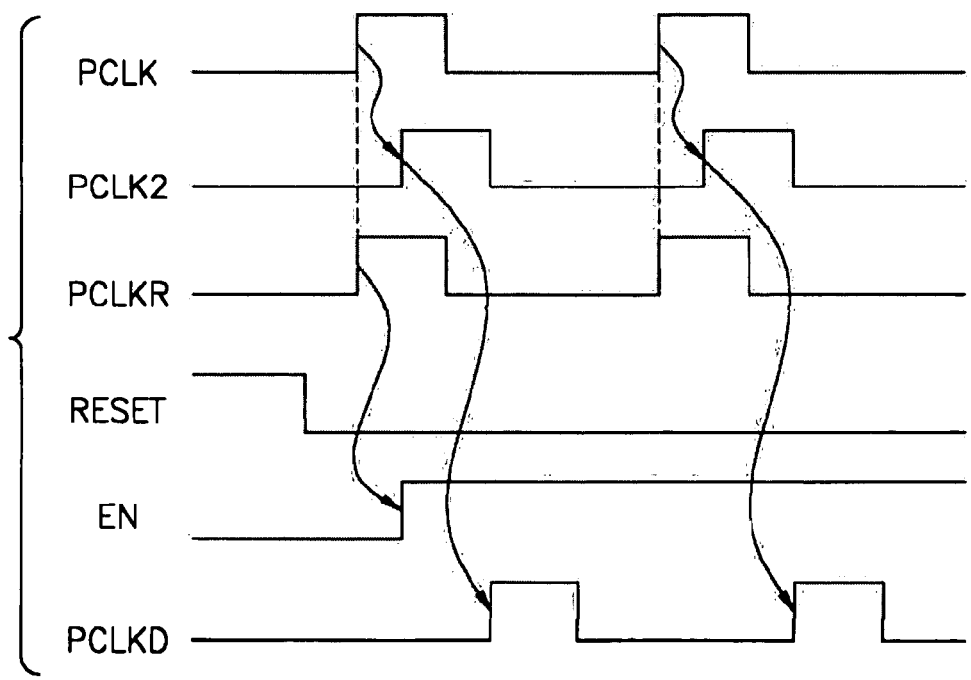
FIG. 8 illustrates the operation of the master clock generator in FIG. 7.

FIG. 8 illustrates the operation of the master clock generator 700. As shown, when the reset signal is enabled, the NMOS transistor 708 pulls the enable signal to logic low. As a result, the AND gate 710 generates a logic low master clock signal PCLKD. When the reset signal is no longer enabled, the replica internal clock signal PCLKR controls the state of the enable signal such that at the rising edge of the replica internal clock signal PCLKR, the enable signal transitions to a logic high state. As a result, the AND gate 710 will output the delayed internal clock signal PCLK2 as the master clock signal PCLKD. The replica internal clock signal PCLKR is generated from output of the DLL circuit 120. As a result, the replica internal clock signal PCLKR experiences some jitter, which decreases the frequency performance of the memory device. By using the replica internal clock signal PCLKR to enable the master clock signal PCLKD and by outputting the master clock signal PCLKD as a delayed version of the internal clock signal PCLK, which has not experienced such jitter, the master clock generator 700 generates a master clock signal PCLKD without jitter. Furthermore, because the internal clock signal PCLK is used as an internal clock signal for many of the peripheral circuits in the memory device 400, the internal clock signal PCLK experiences a large load. By contrast, the master clock signal. PCLKD is not as loaded, and therefore can be used as a clock signal of the latency circuit 500 as described in detail below.

Figure 5:
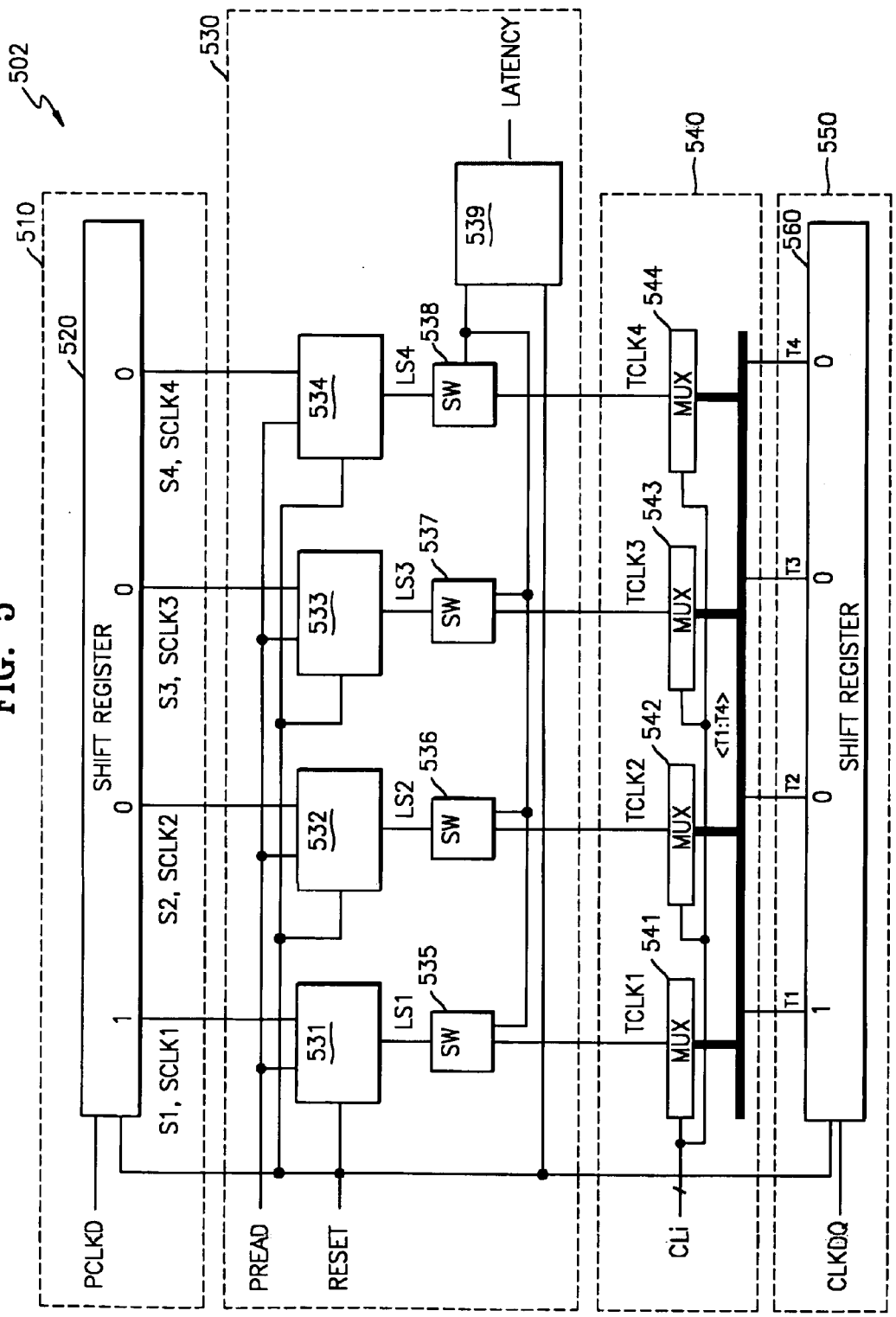
FIG. 5 illustrates an embodiment of the latency signal generator in FIGS. 4A-4C.

FIG. 5 illustrates an exemplary embodiment of the latency signal generator 502. As shown, the latency signal generator 502 includes a sampling signal generator 510 generating first-fourth sampling signals S1-S4 that, in this embodiment, serve as first-fourth sampling clock signals SCLK1-SCLK4, respectively. Accordingly, in this embodiment, the sampling signal generator 510 serves as a sampling clock signal generator, which generates the sampling clock signals based on the master clock signal PCLKD. Similarly, a transfer signal generator 550 generates first-fourth transfer signals T1-T4 based on the data output clock signal CLKDQ. The sampling clock signal generator 510 and the transfer signal generator 550 include first and second ring shift registers 520 and 560, respectively, such as illustrated in FIG. 6.

Figure 6:
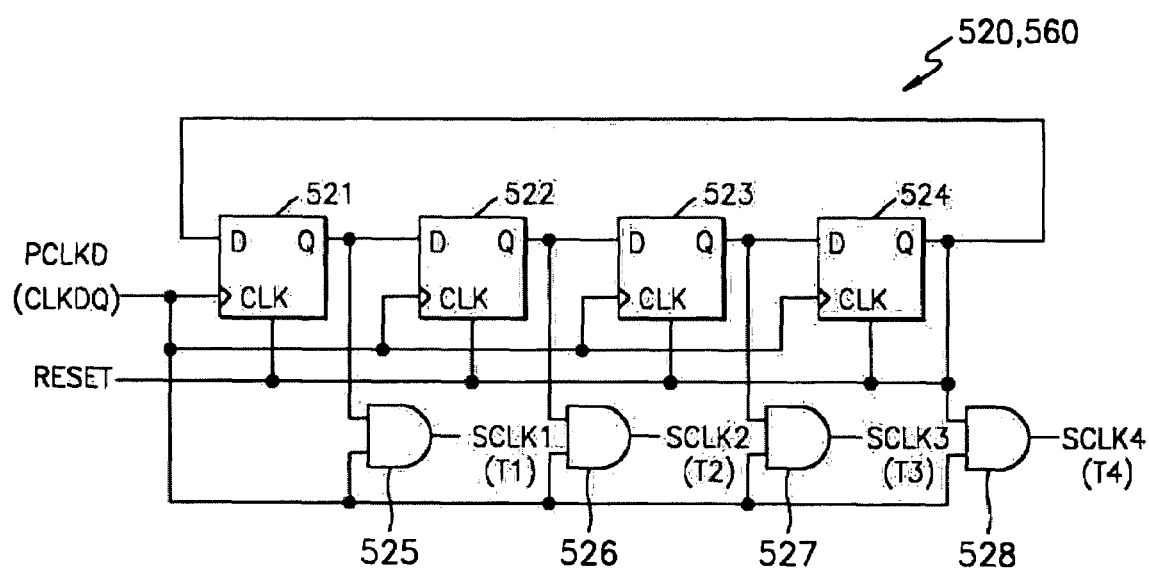
FIG. 6 illustrates an embodiment of the sample clock signal generator and the transfer signal generator of FIG. 5.

As shown in FIG. 6, first-fourth D-flip flops 521-524 are connected in cascade. First-fourth AND gates 525-528 have one input connected to a Q output of the first-fourth D-flip flops 521-524, respectively. The other input of the first-fourth AND gates 525-528 and the clock inputs of the first-fourth D-flip flops 521-524 receive the master clock signal PCLKD in the case of the sampling clock signal generator 510 or the data output clock signal CLKDQ in the case of the transfer signal generator 550. Also as shown, the Q output of the fourth and final D-flip flop 524 is fed to the D input of the first D-flip flop 521. The outputs of the first-fourth AND gates 525-528 supply the first-fourth sampling clock signals SCLK1-SCLK4 in the case of the sampling clock signal generator 510 or supply the first-fourth transfer signals T1-T4 in the case of the transfer signal generator 550. Lastly, the reset inputs of the first-fourth D-flip flops 521-524 receive the reset signal. The first D-flip flop 521 is a settable D-flip flop and the second-fourth D-flip flops 522-524 are resettable D-flip flops. The reset signal enables the pre-setting of the shift register such that the first D-flip flop is SET(logic high state) and the others are RESET(logic low state).

The logic high signal will load into the first D-flip flop 521 on the rising edge of the received clock signal, and this pulse will be transferred to the second-fourth D-flip flops 522-524 as each clock signal pulse is received. Accordingly, when the logic high signal resides in a respective one of the first-fourth D-flip flops 521-524, the corresponding one of the first-fourth AND gates 525-528 outputs a logic high pulse in synchronization with the received clock signal. This operation is illustrated in FIGS. 9A, 9D, and 9E-9M. FIG. 9A illustrates the reset signal, FIGS. 9D and 9E illustrate the data output clock signal CLKDQ and the master clock signal PCLKD, respectively. FIGS. 9F-9I illustrate the first-fourth transfer signals T1-T4, and FIGS. 9J-9M illustrate the first-fourth sampling clock signals SCLK1-SCLK4.

Returning to FIG. 5, the latency signal generator 502 further includes a read information storage unit 530. The read information storage unit 530 includes first-fourth latches 531-534. The first-fourth latches 531-534 receive the first-fourth sampling clock signals SCLK1-SCLK4, respectively, at their clock inputs, receive the internal read signal PREAD at their latch input, have their reset input connected to the reset signal, and generate first-fourth output signals LS1-LS4, respectively. Each latch will latch the internal read signal PREAD on the rising edge of the respectively received sampling clock signal. This operation is illustrated in FIGS. 9N-9R.

FIG. 9N illustrates the internal read signal PREAD, and FIGS. 9O-9R illustrate the output signals LS1-LS4. As shown, if the PREAD signal is logic high when the third sampling clock SCLK3 illustrated in FIG. 9L transitions to logic high, the third latch 533 latches the logic high PREAD signal and generates a logic high output signal LS3.

FIG. 5 further illustrates that the first-fourth output signals LS1-LS4 are received by first-fourth switches 535-538, respectively. The outputs of the switches are each connected to an output latch 539. Whether the first-fourth switches 535-538 transfer the respectively received first-fourth output signals LS1-LS4 to the output latch 539 depends upon the state of the transfer signal received by that switch as will be described in more detail below. For example, if the third switch 537 receives a logic high transfer signal when the third output signal LS3 is logic high as shown in FIG. 9Q, then the logic high output signal LS3 is transferred to the latch 539 and a logic high latency signal is generated as shown in FIG. 9S. As with the first-fourth latches 531-534, the reset input of the output latch 539 is also connected to the reset signal, and the state thereof is reset to zero when the reset signal is enabled.

The latency signal generator 502 illustrated in FIG. 5 further includes a mapping unit 540. The mapping unit 540 includes first-fourth multiplexers 541-544, which are four input by one output multiplexers. Each of the first-fourth multiplexers 541-544 receives each of the first-fourth transfer signals T1-T4, and outputs one of the first-fourth transfer signals T1-T4 to a respective one of the first-fourth switches 535-538 in the read information storage unit 530. The selection made by each of the first-fourth multiplexers 541-544 is controlled by the CAS latency information as discussed in greater detail below.

The latency signal generator 502 illustrated in FIG. 5 supports four CAS latency modes as evidenced by the four D-flip flops, latches, switches and multiplexers in the circuits forming the latency signal generator 502. However, the present invention is not limited to supporting four CAS latency modes, and could support greater or fewer CAS latency modes by increasing or decreasing the number of D-flip flops, latches, switches and multiplexers forming the latency circuit 500.

Figure 10A:
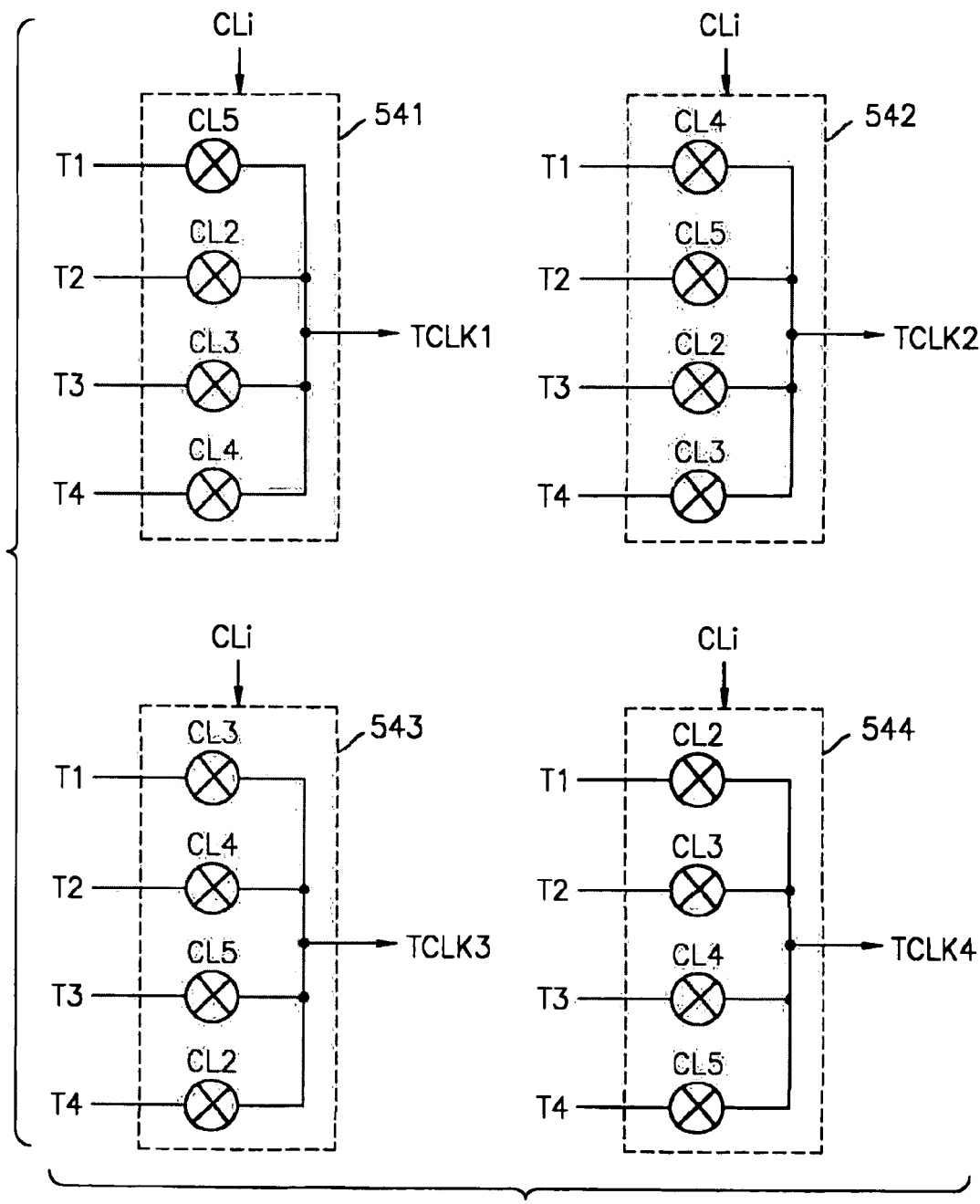
FIG. 10A illustrates an embodiment of the multiplexers in FIG. 5.

FIG. 10A illustrates an embodiment of the first-fourth multiplexers 541-544 wherein the four CAS latency modes supported are modes 2-5. As shown, each of the first-fourth multiplexers 541-544 maps one of the first-fourth transfer signals T1-T4 into an output transfer signal TCLK1-TCLK4, respectively. Here, the N bits forming the CAS latency information may be used as the selection signal of the first-fourth multiplexers 541-544 as illustrated in FIG. 10A. Alternatively, as illustrated in FIG. 10A as well, gates in each of the first-fourth multiplexers 541-544 are controlled by a respective CAS latency indicator CL2-CL5. The CAS latency indicators are decoded from the CAS latency information in the manner discussed in the Background of the Invention section. Each gate selectively transfers one of the transfer signals T1-T4 as a transfer clock signal TCLK1-TCLK4 based on the respective CAS latency indicator. FIG. 10B illustrates which of the first-fourth transfer signals T1-T4 is mapped to the first-fourth output transfer signals TCLK1-TCLK4 for the embodiment of the multiplexers illustrated in FIG. 10A.

Next, a high frequency operation of the memory device according to the embodiment illustrated in one of FIGS. 4A-4C and FIGS. 5, 6, 7, 10A and 10B will be described with respect to FIGS. 9A-9T. FIG. 9A illustrates the reset signal. When enabled, the reset signal resets the DLL circuit 120, the read command path block 130, the master clock generator 700 and the latency circuit 500. As a result, as shown in FIGS. 9D-9M and 9S, the data output clock signal CLKDQ, the master clock signal PCLKD, the first-fourth transfer signals T1-T4, the first-fourth sampling clock signals SCLK1-SCLK4, and the latency signal are reset to a logic low or zero state.

FIG. 9B illustrates the external clock signal ECLK. Pulses of the external clock signal ECLK have been labeled 1, 2, 3, etc., in order to provide an understanding of the relationship between the external clock signal ECLK and both the data output clock signal CLKDQ and the master clock signal PCLKD. As shown in FIG. 9D, after a first internal delay period tRS1, the DLL circuit 120 begins generating the output clock signal CLKDQ. As shown in FIG. 9E, after a second internal delay period tRS2, the master clock generator 700 begins generating the master clock signal PCLKD. As was described previously, the output data clock signal CLKDQ precedes the external clock signal ECLK by a time period tSAC. The clock pulses of the output data clock signal CLKDQ have also been numbered 1, 2, 3, etc., to show the relationship between these clock signal pulses and the clock signal pulses of the external clock signal ECLK. The master clock generator 700 begins generating the master clock signal PCLKD, a time period equal to tSAC plus tREAD after the output data clock signal CLKDQ is generated. The time period tSAC has been discussed in detail above. The time period tREAD is the period of time between receipt of the read command and generation of the internal read signal PREAD by the read command buffer 134. The pulses of the master clock signal PCLKD illustrated in FIG. 9E have also been labeled 1, 2, 3, etc., to show the correspondence between these clock signal pulses and the clock signal pulses of the data output clock signal CLKDQ and the external clock signal ECLK. Accordingly, it will be understood that the reset operation establishes the timing relationships between these clock signals.

As shown in FIGS. 9F-9I with respect to FIG. 9D, once the transfer signal generator 550 begins receiving clock signal pulses of the output data clock signal CLKDQ, pulses of the first-fourth transfer signals T1-T4 are generated. As demonstrated by FIGS. 9F-9I, each transfer signal has a frequency equal to the frequency of the external clock signal ECLK divided by the maximum number of supported CAS latency modes. Namely, it will be appreciated that the frequency of the transfer signals is determined by the number of D-flip flops in the second ring shift register 560.

FIGS. 9J-9M with respect to FIG. 9E illustrate that the first-fourth sampling clock signals SCLK1-SCLK4 are generated by the sampling clock signal generator 510 when the master clock generator 700 begins generating pulses of the master clock signal PCLKD. As with the transfer signals, the sampling clock signals also have a frequency that is equal to the frequency of the external clock signal ECLK divided by the maximum number of supported CAS latency modes. Namely, the frequency of the first-fourth sampling clock signals SCLK1-SCLK4 is determined by the number of D-flip flops in the first ring shift register 520.

The above discussed operation of the embodiment according to the present invention holds for any of the four possible CAS latency modes two-five, supported by this embodiment of the invention. FIGS. 9F-9I include parentheticals that show which of the first-fourth transfer signals T1-T4 are mapped to the first-fourth output transfer signals TCLK1-TCLK4 when the CAS latency mode is 4. Also, FIGS. 9O-9T illustrate the output signals LS1-LS4, the latency signal, and the data output from the memory device 400 when the CAS latency mode is 4 and a read command is received by the memory device 400 as illustrated in FIG. 9C.

As shown in FIG. 9C, in this operational example, the read command signal is received when clock signal pulse 3 of the external clock signal ECLK transitions to logic high. Consequently, as shown in FIG. 9N, the internal read signal PREAD is generated after an internal delay of tREAD, by the read command path block 130.

As shown in FIGS. 9F-9I, when the CAS latency is 4, the first-fourth transfer signals T1-T4 are mapped by the mapping unit 540 to the second, third, fourth and first output signals TCLK2, TCLK3, TCLK4 and TCLK1. Stated another way, first-fourth switches 535-538 receive the fourth, first, second and third transfer signals T1-T4, respectively. As such, when the internal read signal PREAD transitions to logic high as shown in FIG. 9N, the third sampling clock signal SCLK3 causes the third latch 533 to latch the logic high PREAD signal. The other latches will have latched logic low PREAD. Accordingly, only the third output signal LS3 from the third latch 533 will have a logic high state as shown in FIGS. 9O-9R.

Then, when the second transfer signal T2 transitions to logic high, the third switch 537 supplies a logic high signal to the output latch 539, which in turn supplies a logic high latency signal as shown in FIG. 9S. Because the latency signal is logic high when the output data clock signal CLKDQ transitions high at pulse 7 of the output data clock signal CLKDQ, the memory device 400 will output data D1 as shown in FIG. 9T at the rising edge of pulse 7 of the external clock signal ECLK as shown in FIG. 9B. Accordingly, with the read command having been received during pulse 3 of the external clock signal ECLK and the data being output from the memory device 400 at pulse 7 of the external clock signal ECLK, a CAS latency of 4 is achieved for the high frequency operation shown in FIG. 9B. In this embodiment, a single data word is output; however, the present invention is not limited to this embodiment. Instead, by increasing the length of the read command, the number of data words output can be increased.

As will be appreciated, the mapping unit 540 selectively associates the transfer signals with the sampling clock signals based on the CAS latency to create a desired timing relationship between the sampling and transfer signals. This relationship then controls the time period between the receipt of a read command and the output of data by the memory device 400. More specifically, this relationship controls the time period between receipt of the internal read signal PREAD and the generation of the latency signal. Here, the sampling clock signals trigger the first-fourth latches 531-534 and thus serve to designate a point in time when the read command is received. The association of the transfer signals with the sampling clock signals then serves as a second pointer in time as to when the latency signal should be generated. Through this arrangement and methodology, read operation errors during high frequency operation are prevented.

Figure 11:
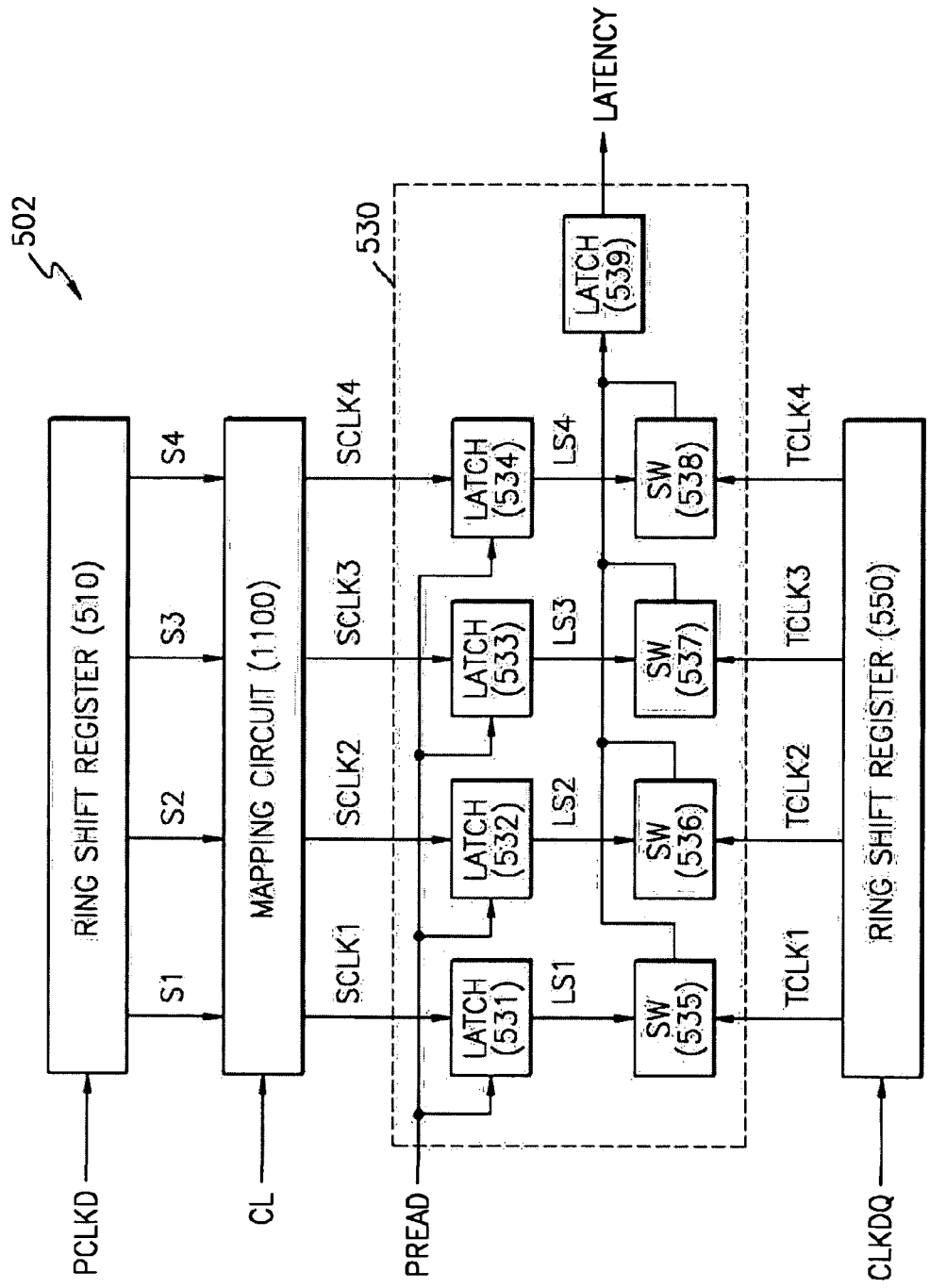
FIG. 11 illustrates another embodiment of the latency signal generator in FIGS. 4A-4C.

FIG. 11 illustrates another embodiment of the latency signal generator 502 according to the present invention. As shown, the latency signal generator 502 in this embodiment is the same as the embodiment of FIG. 5, except that the mapping unit 540 has been eliminated and a new mapping unit 1100 has been added. Also, the reset signal has been deleted, but only to simplify the description. In view of the above, only the differences between the embodiments of FIGS. 11 and 5 will be described for the sake of brevity.

With the elimination of the mapping unit 540, the transfer signals T1-T4 generated by the transfer signal generator 550 are directly supplied to the first-fourth switches 535-538 as the first-fourth transfer clock signals TCLK1-TCLK4, respectively. Accordingly, in this embodiment, transfer signal generator 550 serves as a transfer clock signal generator.

Figure 13A:
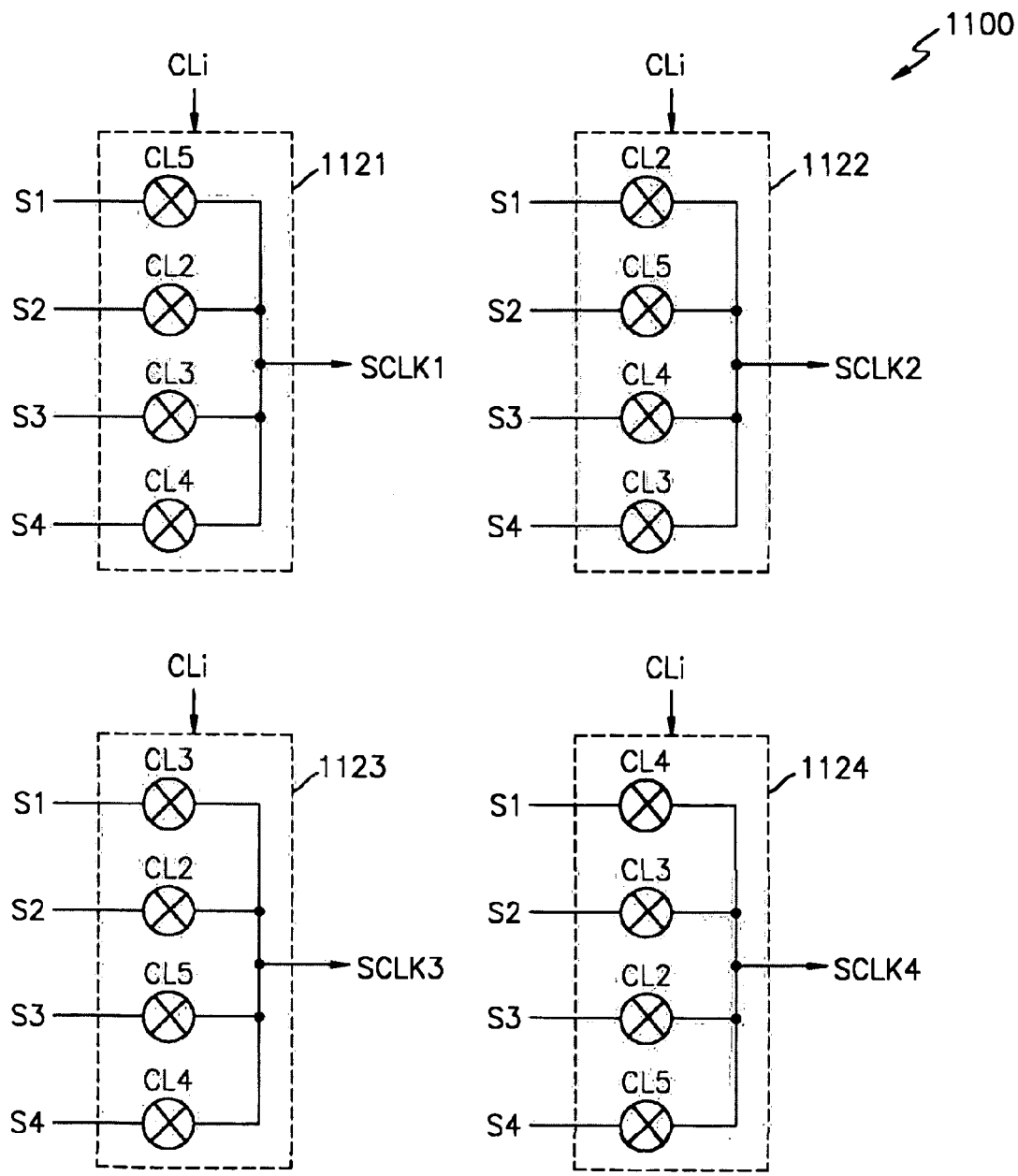
FIG. 13A illustrates an embodiment of the multiplexers in FIG. 11.

The mapping unit 1100 maps the first-fourth sampling signals S1-S4 to the first-fourth latches 531-534 as the first-fourth sampling clock signals SCLK1-SCLK4. The mapping unit 1100 includes first-fourth multiplexers 1121-1124, which are four input by one output multiplexers, as shown in FIG. 13A. Each of the first-fourth multiplexers 1121-1124 receives each of the first-fourth sampling signals S1-S4, and outputs one of the first-fourth sampling signals S1-S4 to a respective one of the first-fourth latches 531-534 in the read information storage unit 530. The selection made by each of the first-fourth multiplexers 1121-1124 is controlled by the CAS latency information as shown in FIG. 13A.

The latency signal generator 502 illustrated in FIG. 11 supports four CAS latency modes as evidenced by the four D-flip flops, latches, switches and multiplexers in the circuits forming the latency signal generator 502. However, the present invention is not limited to supporting four CAS latency modes, and could support greater or fewer CAS latency modes by increasing or decreasing the number of D-flip flops, latches, switches and multiplexers forming the latency signal generator 502.

FIG. 13A illustrates an embodiment of the first-fourth multiplexers 1121-1124 wherein the four CAS latency modes supported are modes 2-5. As shown, each of the first-fourth multiplexers 1121-1124 maps one of the first-fourth sampling signals S1-S4 into a sampling clock signal SCLK1-SCLK4, respectively. Here, the N bits forming the CAS latency information may be used as the selection signal of the first-fourth multiplexers 1121-1124 as illustrated in FIG. 13A. Alternatively, as illustrated in FIG. 13A as well, gates in each of the first-fourth multiplexers 1121-1124 are controlled by a respective CAS latency indicator CL2-CL5.

The CAS latency indicators are decoded from the CAS latency information in the manner discussed in the Background of the Invention section. Each gate selectively transfers one of the sampling signals S1-S4 as a sampling clock signal SCLK1-SCLK4 based on the respective CAS latency indicator. FIG. 13B illustrates which of the first-fourth sampling signals S1-S4 is mapped to the first-fourth sampling clock signals SCLK1-SCLK4 for the embodiment of the multiplexers illustrated in FIG. 13A.

FIGS. 12A-12S illustrate the high frequency operation of the memory device according to the embodiment illustrated in one of FIGS. 4A-4C and FIGS. 11, 6, 7, 13A and 13B for the CAS latency mode of four. FIGS. 12A-12S correspond to FIGS. 9B-9E, 9N, 9F-9M, and 9O-9T, respectively. Accordingly, FIGS. 12A-12S will not be described in detail for the sake of brevity.

Figure 14:
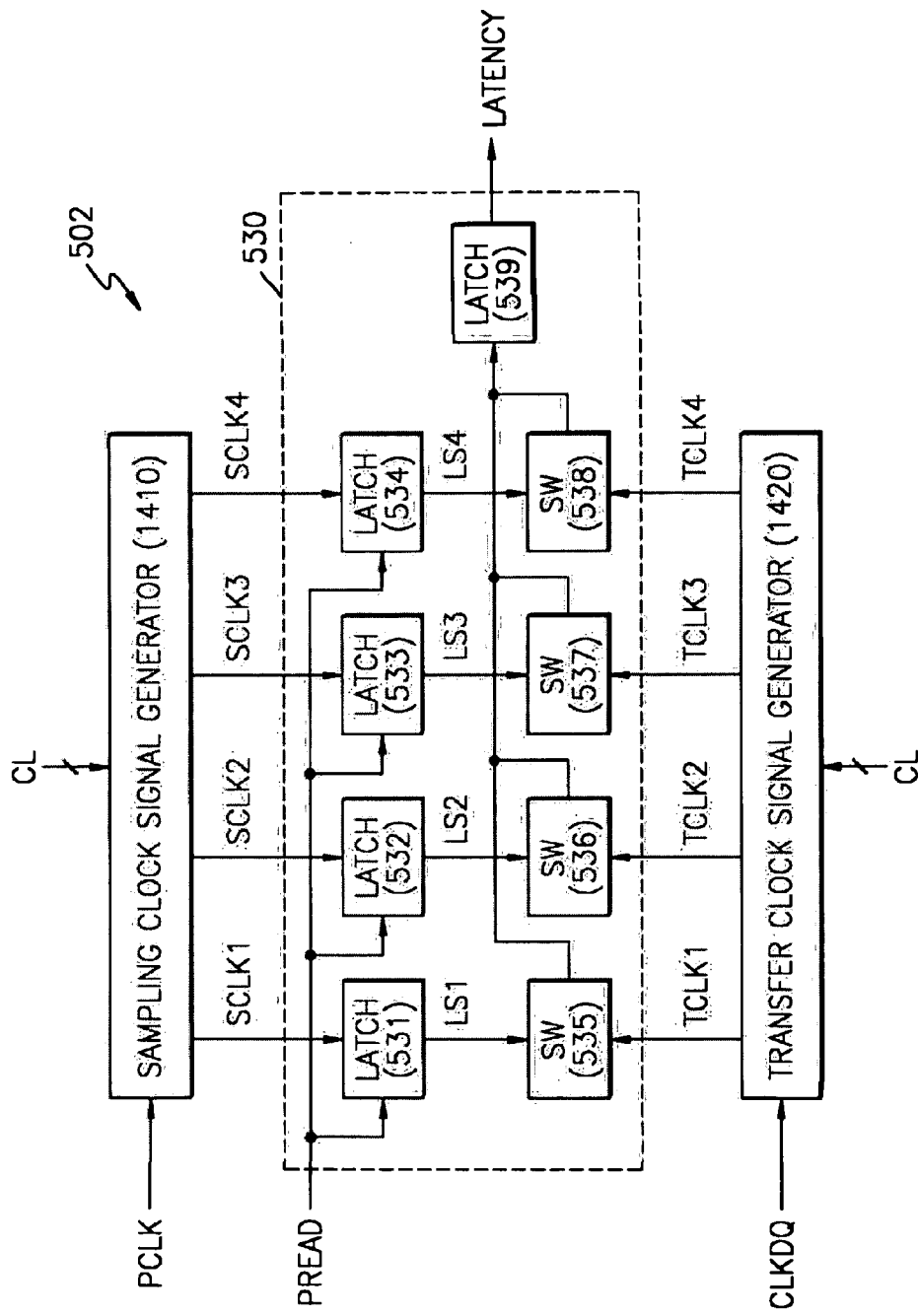
FIG. 14 illustrates another embodiment of the latency signal generator in FIGS. 4A-4C.

FIG. 14 illustrates a further exemplary embodiment of the latency signal generator 502. As shown, the latency signal generator 502 in this embodiment includes a sampling clock signal generator 1410, which selectively generates the first-fourth sampling clocks SCLK1-SCLK4 based on the CAS latency information, and a transfer clock signal generator 1420, which selectively generates the first-fourth transfer clocks TCLK1-TCLK4 based on the CAS latency information. The generated sampling clock and transfer clock signals are supplied to the read information storage unit 530 described in detail above with respect to the embodiment of FIG. 5. Accordingly, only the sampling clock signal generator 1410 and the transfer clock signal generator 1420 will be described in detail below. Also, as with the embodiment of FIG. 11, the reset signal has been deleted, but only to simplify the description.

Figure 15:
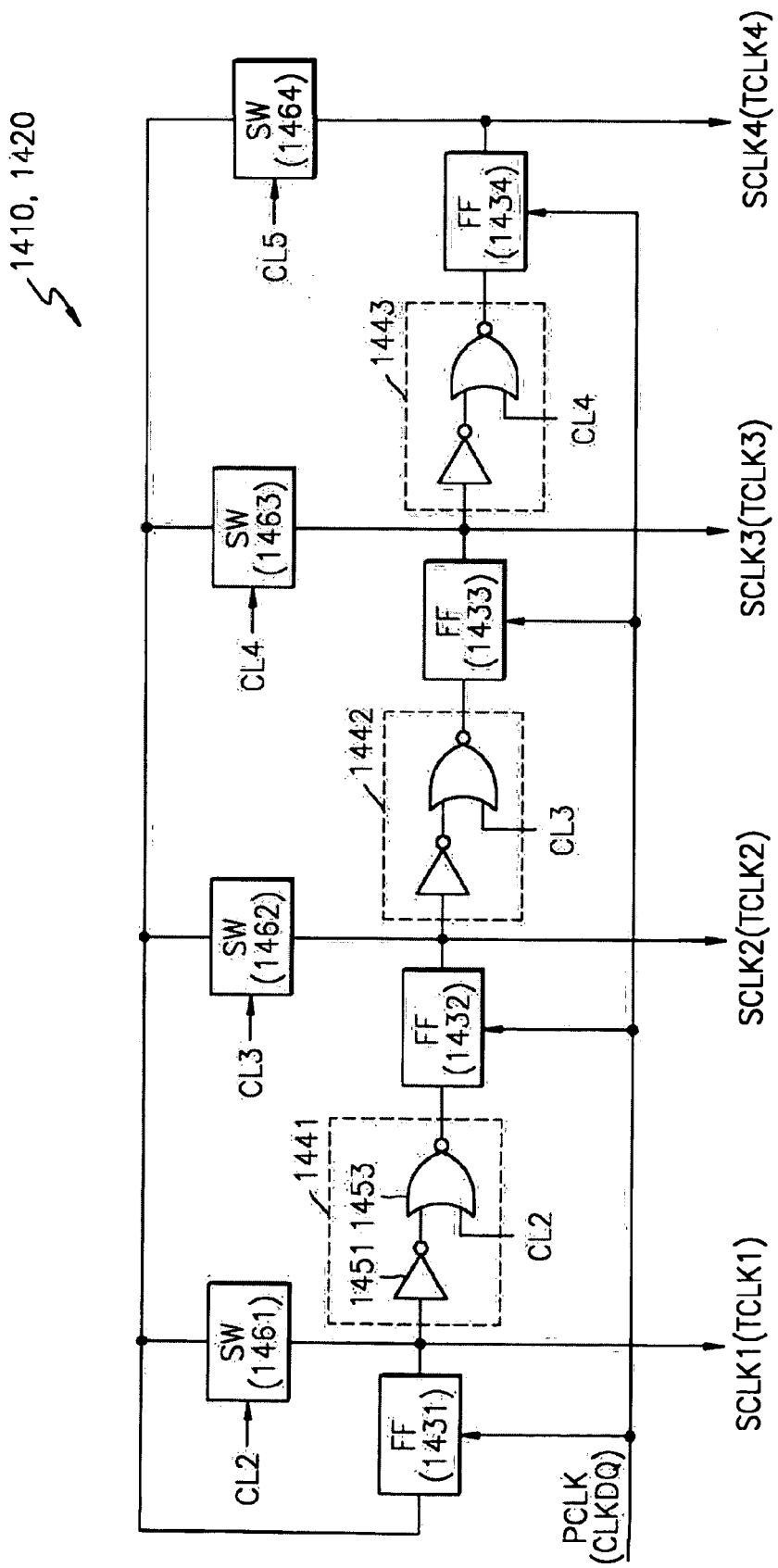
FIG. 15 illustrates an embodiment of the sample clock signal generator and the transfer signal generator of FIG. 14.

The sampling clock signal generator 1410 and the transfer clock signal generator 1420 include a ring shifter cooperatively associated with control logic such as illustrated in FIG. 15 to selectively generate the respective clock signals. As shown in FIG. 15, first-fourth D-flip flops 1431-1434 are connected in cascade with first-third control logic units 1441-1443 disposed between the first and second, second and third and third and fourth D-flip flops, respectively.

Each of the first-third control logic units 1441-1443 includes an inverter 1451 receiving and inverting the Q output of the previous D-flip flop. A NOR gate 1453 receives the output of the inverter and a respective CAS latency indicator decoded in the well-known manner from the CAS latency information. As shown in FIG. 15, the CAS latency indicators CL2-CL4 for the second-fourth CAS latency modes are respectively supplied as an input to the NOR gate 1453 in the first-third control logic units 1441-1443. The output of the NOR gate 1453 is supplied to the D input of the next D-flip flop. The clock inputs of the first-fourth D-flip flops 1431-1434 receive the master clock signal PCLKD in the case of the sampling clock signal generator 1410 or the data output clock signal CLKDQ in the case of the transfer clock signal generator 1420.

The Q outputs of the first-fourth D-flip flops 1431-1434 are received by first-fourth switches 1461-1464. The first-fourth switches 1461-1464 selectively connect the Q outputs of the first-fourth D-flip flops 1431-1434 with the D input of the first D-flip flop 1431 based on the respectively received CAS latency indicators CL2-CL5 for the second-fifth CAS latency modes. The Q outputs of the first-fourth D-flip flops supply the first-fourth sampling clock signals SCLK1-SCLK4 in the case of the sampling clock signal generator 1410 or supply the first-fourth transfer clock signals TCLK1-TCLK4 in the case of the transfer clock signal generator 1420. Lastly, while not shown, the reset inputs of the first-fourth D-flip flops 1431-1434 receive the reset signal. The first-fourth D-flip flops 1431-1434 are resettable D-flip flops. The reset signal enables the pre-setting of the shift register such that the first-fourth D-flip flops are reset (logic low state). Additional control logic well-known in the art (not shown) is connected to the D input of the first D-flip flop 1431 to load a logic "1" (logic high state) into the first D-flip flop 1431.

The logic high signal will load into the first D-flip flop 1431 on the rising edge of the received clock signal (PCLKD or CLKDQ ), and this pulse will be transferred to the second-fourth D-flip flops 1432-1433 depending on the CAS latency information as each clock signal pulse is received. When the logic high signal resides in a respective one of the first-fourth D-flip flops 1431-1434, the corresponding sampling clock signal/transfer clock signal is active.

When the first-third control logic units 1441-1443 receive a logic low CAS latency indicator, the first-third control logic units 1441-1443 transfer the Q output from the previous D-flip flop to the D input of the next D-flip flop. When the first-third control logic units 1441-1443 receive a logic high CAS latency indicator, the first-third control logic units 1441-1443 output a logic low state to the next D-flip flop regardless of the Q output of the previous D-flip flop.

As will be appreciated, the logic high state loaded into the first D-flip flop 1431 will only be transferred to a next position in the ring shift register selectively formed by the first-fourth D-flip flops 1431-1434 based on the CAS latency information. Thus, the CAS latency information controls the number of active sampling clock signals and transfer clock signals.

For example, if the CAS latency information indicates CAS latency mode 4, then the CAS latency indicators CL2 and CL3 are logic low. Accordingly, the logic high state loaded into the first D-flip flop 1431 will be transferred to the second D-flop flop 1432 and then the third D-flip flop 1433 in synchronization with the received clock signal (PCLKD/CLKDQ). But, this logic high state will not be transferred from the third control logic unit 1443 to the fourth D-flop flop 1434 by third control logic unit 1443 because the third control logic unit 1443 receives a logic high CAS latency indicator CL4. As a result, the first-third sampling clock signal SCLK1-SCLK3 and the first-third transfer clock signals TCLK1-TCLK3 will be activated, but not the fourth sampling clock signal SCLK4 or the fourth transfer clock signal TCLK4.

This operation is illustrated in FIGS. 17A, 17C-D and 17F-M. FIG. 17A illustrates the external clock signal ECLK and FIGS. 17C-D illustrate the data output clock signal CLKDQ and the master clock signal PCLKD generated from the external clock signal ECLK. FIGS. 17F-17I illustrate the first-fourth transfer clock signals TCLK1-TCLK4, and FIGS. 17J-17M illustrates the first-fourth sampling clock signals SCLK1-SCLK4 when the CAS latency mode is 4.

As mentioned above, the CAS latency indicators CL2-CL5 also respectively control operation of the first-fourth switches 1461-1464. When the first-fourth switches 1461-1464 receive a logic high CAS latency indicator, the first-fourth switches 1461-1464 connect the respectively received Q output from the first-fourth D-flip flops 1431-1434 with the D input of the first D-flip flop 1431. For example, when the CAS latency information indicates a CAS latency mode of 4, then the CAS latency indicator CL4 is a logic high state, and only the third switch 1463 closes. This connects the Q output of the third D-flip flop 1433 to the D input of the first D-flip flop 1431. As discussed above, the logic high state loaded into the first D-flip flop 1431 will only propagate up to the third D-flip flop 1433 when the CAS latency mode is 4. Accordingly, the first-fourth switches 1461-1464 and the first-third control logic units 1441-1443 form control logic selectively configuring a ring shifter having a length dependent on the CAS latency information.

FIG. 16 illustrates tables for CAS latency modes two-five that demonstrate which of the first-fourth transfer clock signals TCLK1-TCLK4 and which of the first-fourth sampling clock signals SCLK1-TCLK4 become active for each CAS latency mode.

Next, a high frequency operation of the memory device according to the embodiment illustrated in FIG. 4A, B or C and FIGS. 14-15 will be described with respect to FIGS. 17A-17S. FIG. 17A illustrates the external clock signal ECLK. Pulses of the external clock signal ECLK have been labeled 1, 2, 3, etc., in order to provide an understanding of the relationship between the external clock signal ECLK and both the data output clock signal CLKDQ and the master clock signal PCLKD. As was described previously, the output data clock signal CLKDQ shown in FIG. 17C precedes the external clock signal ECLK by a time period tSAC. The clock pulses of the output data clock signal CLKDQ have also been numbered 1, 2, 3, etc., to show the relationship between these clock signal pulses and the clock signal pulses of the external clock signal ECLK. As also discussed above, the master clock generator 700 begins generating the master clock signal PCLKD, a time period equal to tSAC plus tREAD after the output data clock signal CLKDQ is generated as shown in FIG. 17D. As shown by FIGS. 17B and 17E, the internal read command PREAD is generated a time period tREAD after receiving the read command. The pulses of the master clock signal PCLKD illustrated in FIG. 17D have also been labeled 1, 2, 3, etc., to show the correspondence between these clock signal pulses and the clock signal pulses of the data output clock signal CLKDQ and the external clock signal ECLK. It will be understood from the description of the previous embodiments, that the reset operation aids in establishing the timing relationships between these clock signals.

As shown in FIGS. 17F-17H with respect to FIG. 17C, once the transfer clock signal generator 1420 begins receiving clock signal pulses of the output data clock signal CLKDQ, pulses of the first-third transfer clock signals TCLK1-TCLK3 are generated. For the reasons described in detail above and as shown by FIG. 17I, because the CAS latency is four, the transfer clock signal generator 1420 does not activate the fourth transfer clock signal TCLK4. As demonstrated by FIGS. 17F-17H, each of the active first-third transfer clock signals has a frequency equal to the frequency of the external clock signal ECLK divided by one less than the CAS latency mode. Namely, it will be appreciated that the frequency of the transfer clock signals is determined by the length of ring shift register configured by the control logic in the transfer clock signal generator 1420 based on the CAS latency mode.

FIGS. 17J-17L with respect to FIG. 17D illustrate that the first-third sampling clock signals SCLK1-SCLK3 are generated by the sampling clock signal generator 1410 in synchronization with the pulses of the master clock signal PCLKD. For the reasons described in detail above and as shown by FIG. 17M, because the CAS latency is four, the sampling clock signal generator 1410 does not activate the fourth sampling clock signal SCLK4. As with the transfer clock signals, the sampling clock signals also have a frequency that is equal to the frequency of the external clock signal ECLK divided by one less than the CAS latency mode. Namely, the frequency of the activated first-third sampling clock signals SCLK1-SCLK3 is determined by the length of ring shift register configured by the control logic in the sampling clock signal generator 1410 based on the CAS latency mode.

FIGS. 17N-17S illustrate the output signals LS1-LS4, the latency signal, and the data output from the memory device 400 when the CAS latency mode is 4 and a read command is received by the memory device 400 as illustrated in FIG. 17B.

As shown in FIG. 17B, in this operational example, the read command signal is received when clock signal pulse zero of the external clock signal ECLK transitions to logic high. Consequently, as shown in FIG. 17E, the-internal read signal PREAD is generated after an internal delay of tREAD, by the read command path block 130. When the internal read signal PREAD transitions to logic high as shown in FIG. 17E, the first sampling clock signal SCLK1 causes the first latch 531 to latch the logic high PREAD signal. The other latches will have latched logic low PREAD. Accordingly, only the first output signal LS1 from the third latch 531 will have a logic high state as shown in FIGS. 17N-17Q.

Then, when the first transfer clock signal TCLK1 transitions to logic high, the first switch 535 supplies a logic high signal to the output latch 539, which in turn supplies a logic high latency signal as shown in FIG. 17R. Because the latency signal is logic high when the output data clock signal CLKDQ transitions high at pulse 4 of the output data clock signal CLKDQ, the memory device 400 will output data D0 as shown in FIG. 9S at the rising edge of pulse 4 of the external clock signal ECLK as shown in FIG. 9A. Accordingly, a CAS latency of 4 is achieved for the high frequency operation shown in FIG. 17A. In this embodiment, a single data word is output; however, the present invention is not limited to this embodiment. Instead, by increasing the length of the read command, the number of data words output can be increased.

Figure 17:
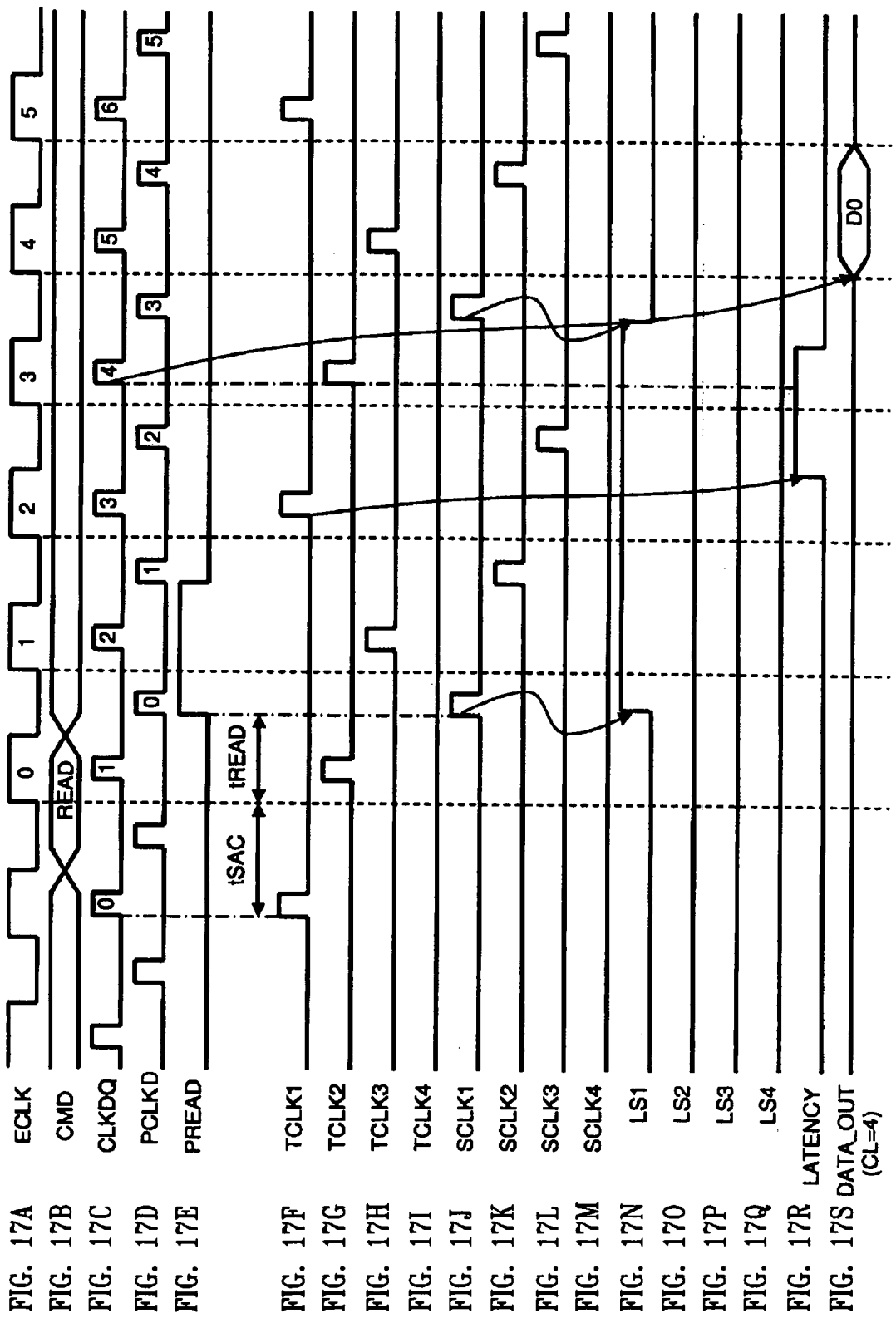
FIGS. 17A-17S illustrate the waveforms of the signals generated by or received by the memory device of FIG. 4A, 4B or 4C having a latency signal generator as illustrated in FIG. 14 when the CAS latency mode is four.
Figure 18:
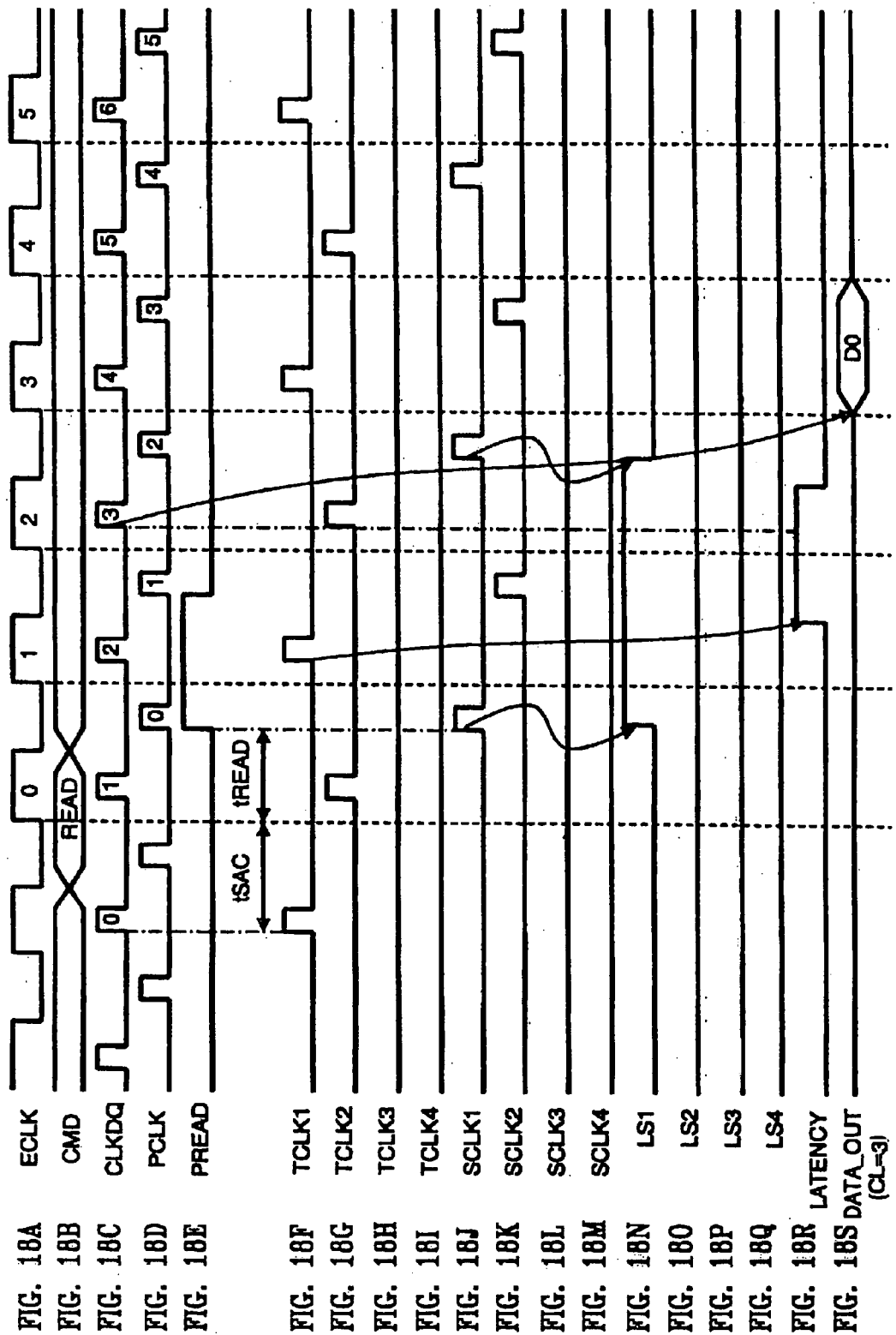
FIG. 18 including FIGS. 18A-18S including
Figure 19:
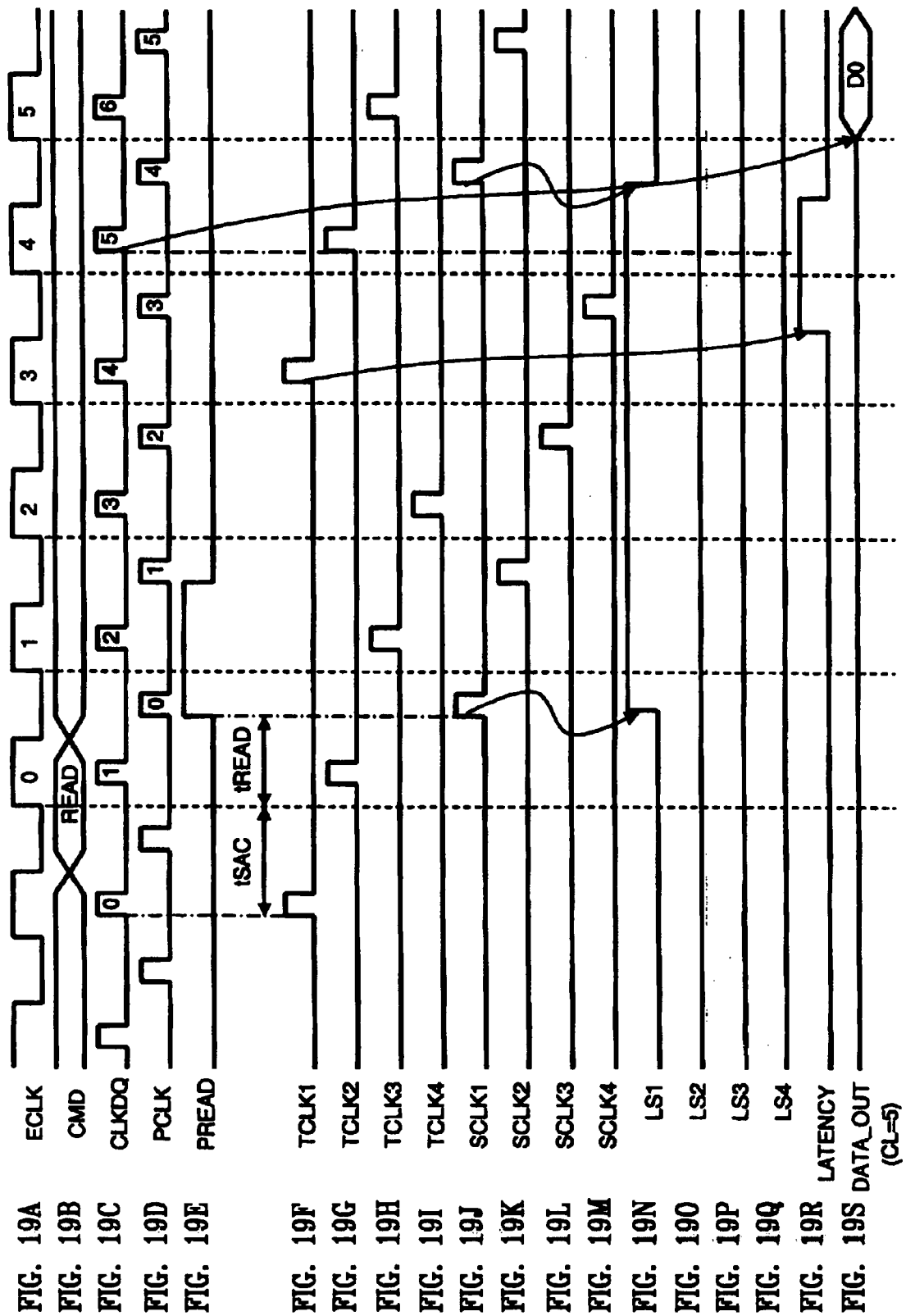
FIGS. 19A-19s illustrate and 19 illustrates waveforms as shown in FIG. 17 for CAS latency modes three and five, respectively.

FIGS. 18 and 19 illustrate timing diagrams corresponding to the timing diagrams in FIG. 17 for CAS latency modes three and five, respectively. As the timing diagrams of FIGS. 18 and 19 are readily understood from the description of the timing diagrams in FIG. 17, the timing diagrams in FIGS. 18 and 19 will not be described in detail for the sake of brevity.

The latency signal generator 502 illustrated in FIG. 14 supports four CAS latency modes as evidenced by the four D-flip flops, latches, switches and multiplexers in the circuits forming the latency signal generator 502. However, the present invention is not limited to supporting four CAS latency modes, and could support greater or fewer CAS latency modes by increasing or decreasing the number of D-flip flops, latches, switches and multiplexers forming the latency circuit 500.

As will be appreciated, the sampling clock signal generator 1410 and the transfer clock signal generator 1420 selectively activate the sampling and transfer clock signals and control the frequency of the activated sampling and transfer clock signals based on the CAS latency to create a desired timing relationship between the sampling and transfer clock signals. This relationship then controls the time period between the receipt of a read command and the output of data by the memory device 400. More specifically, this relationship controls the time period between receipt of the internal read signal PREAD and the generation of the latency signal. As with previous embodiments, the sampling clock signals trigger the first-fourth latches 531-534 and thus serve to designate a point in time when the read command is received. The association of the transfer clock signals with the sampling clock signals then serves as a second pointer in time as to when the latency signal should be generated. Through this arrangement and methodology, read operation errors during high frequency operation are prevention.

Figure 1:
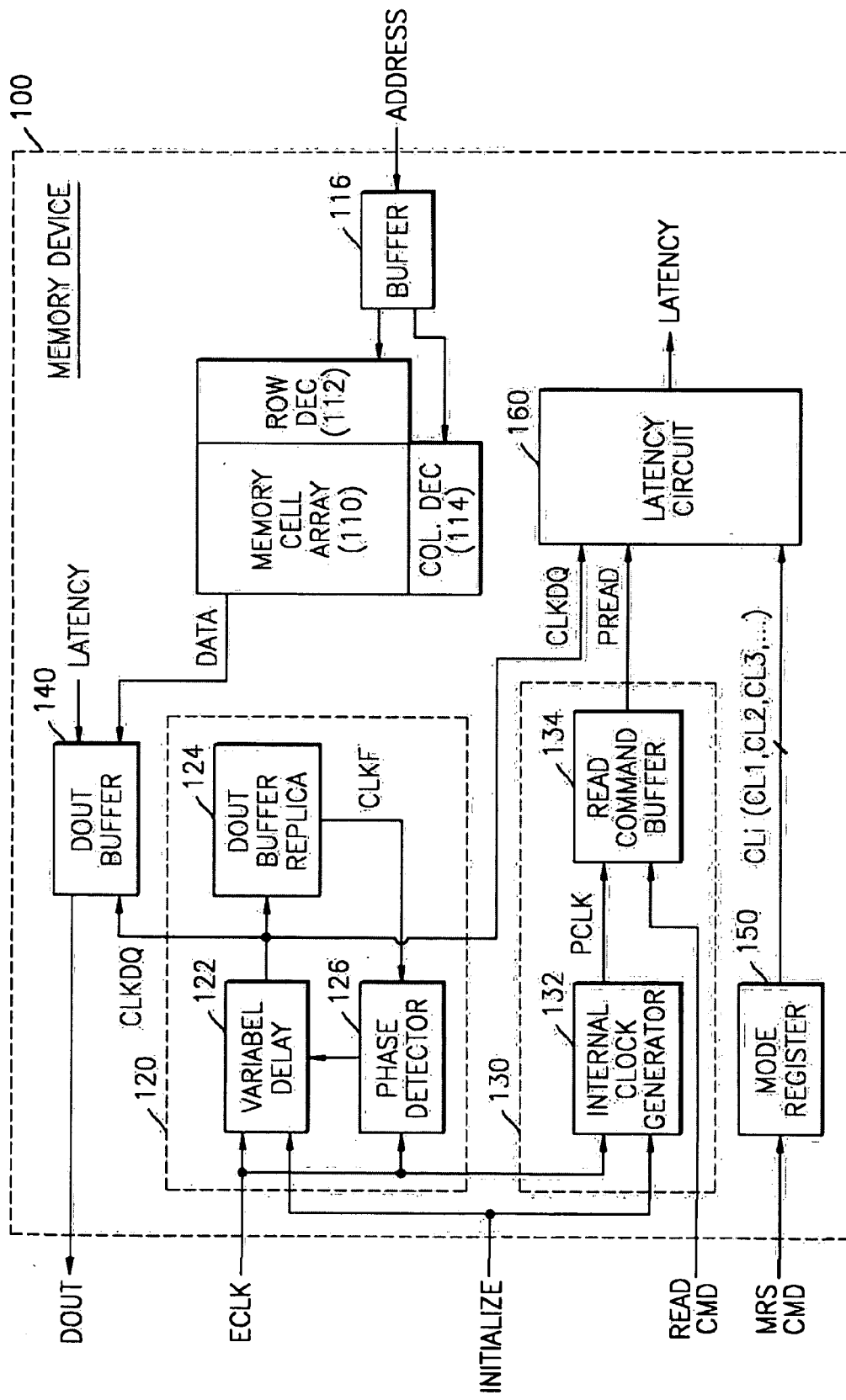
FIG. 1 illustrates a block diagram of a prior art memory device.
Figure 2:
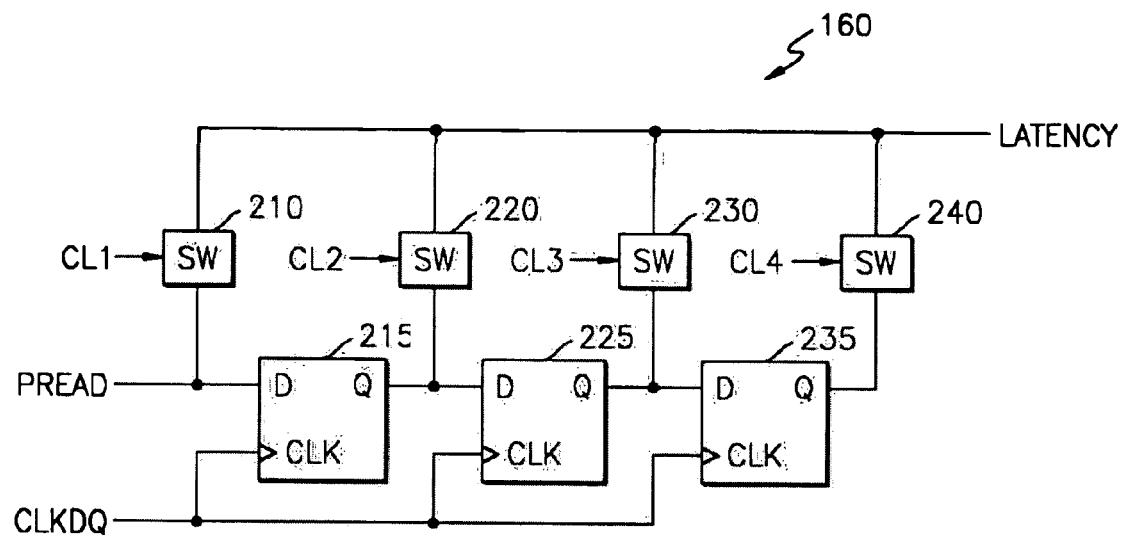
FIG. 2 illustrates a prior art latency circuit.
Figure 3A:
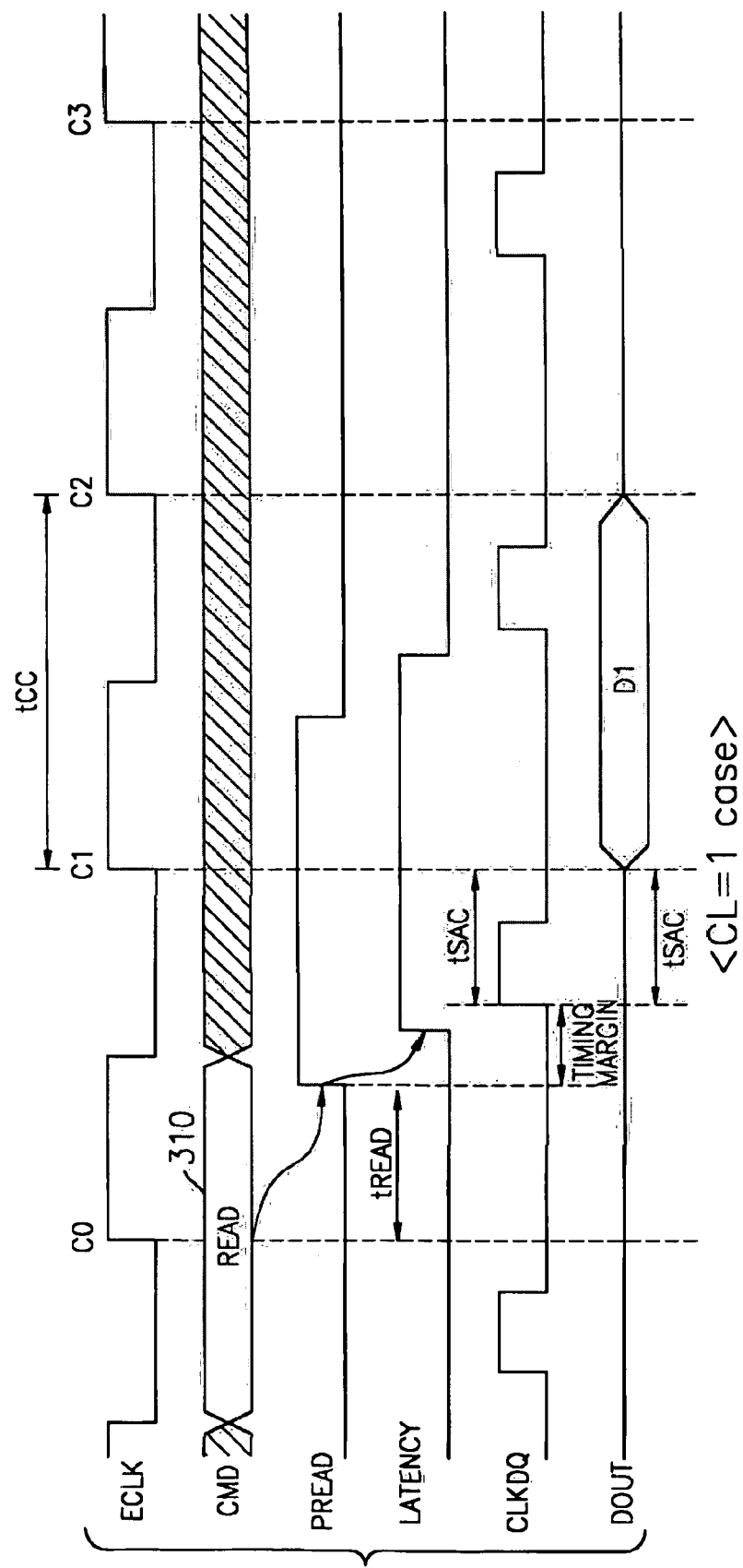
FIG. 3A illustrates a timing diagram of the read operation when the CAS latency is 1 for the memory device of FIG. 1.
Figure 3B:
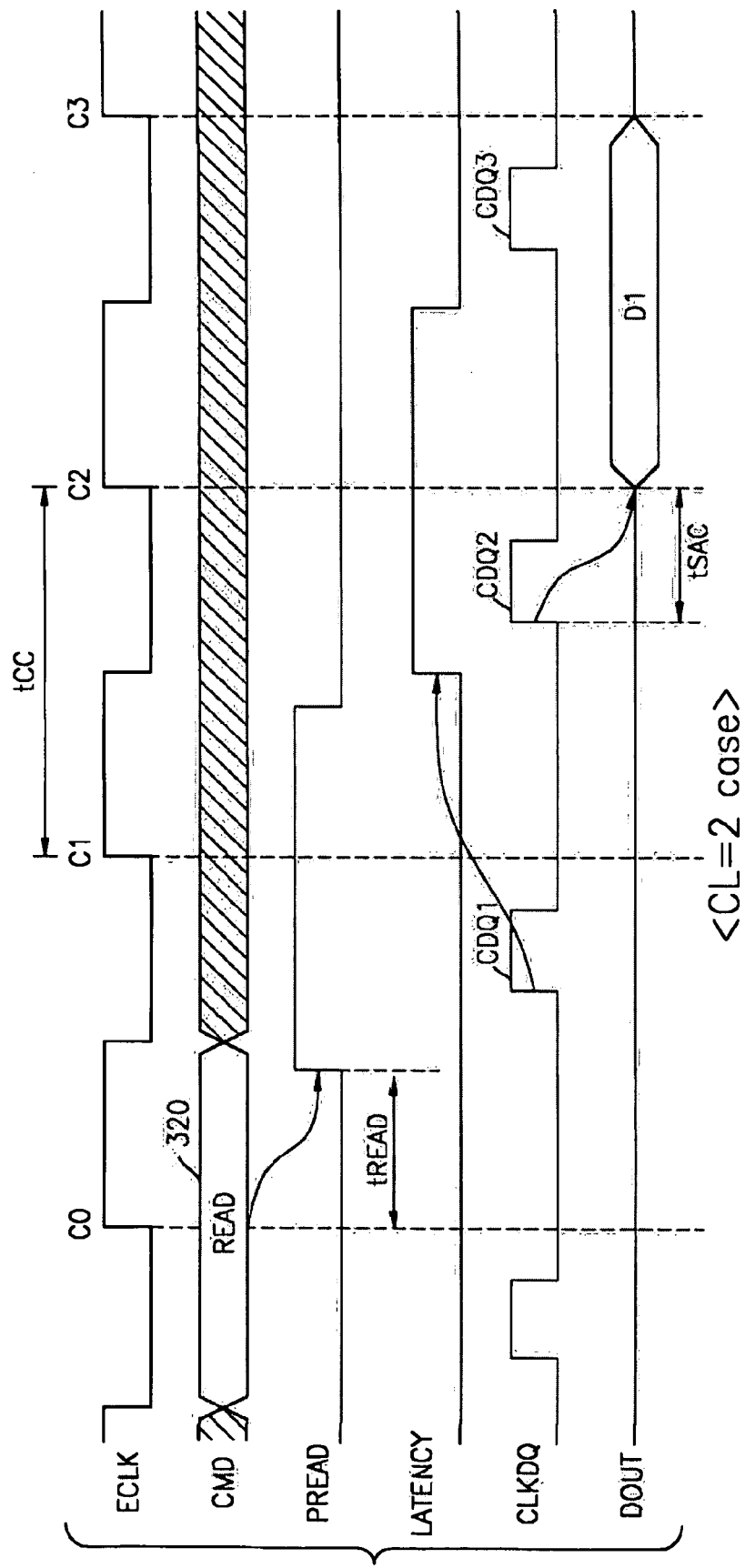
FIG. 3B illustrates a timing diagram of the read operation when the CAS latency is 2 for the memory device of FIG. 1.
Figure 3C:
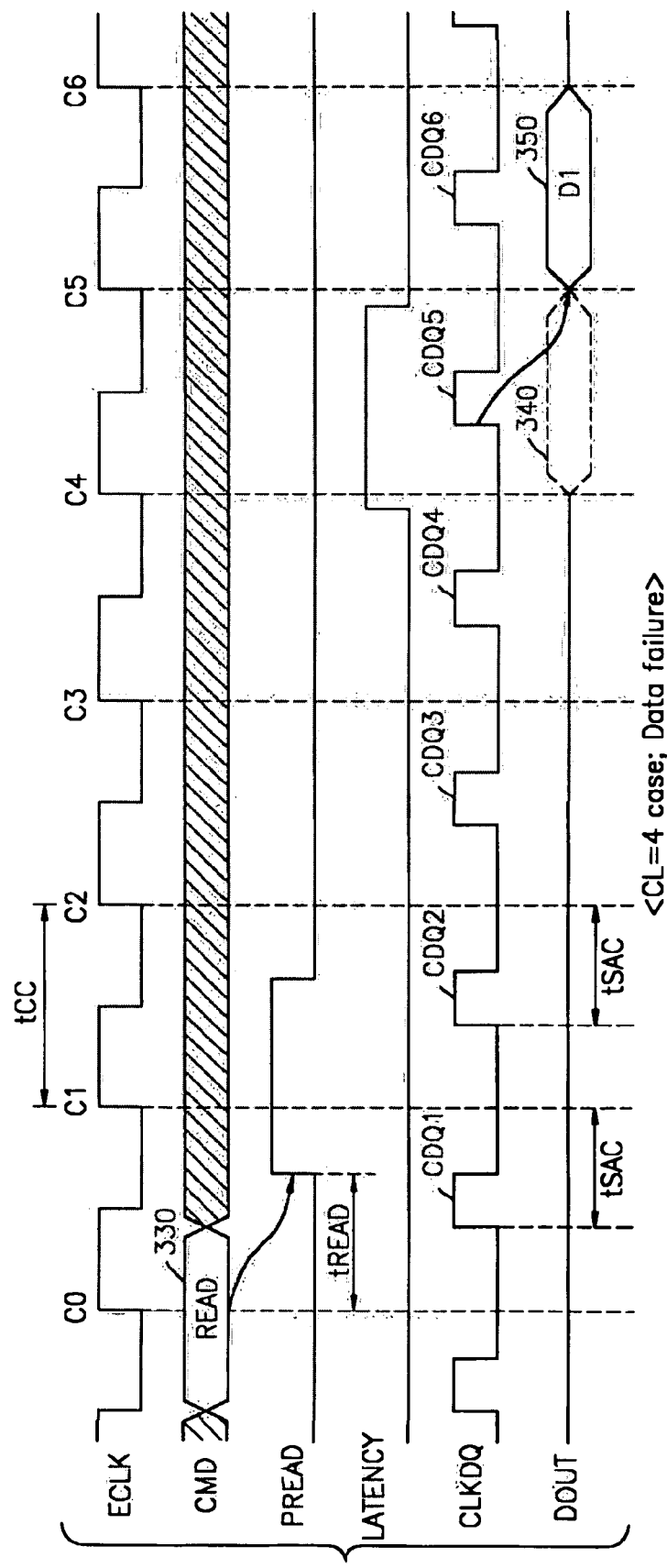
FIG. 3C illustrates a timing diagram of the read operation when the CAS latency is 4 for the memory device of FIG. 1.
Figure 20:
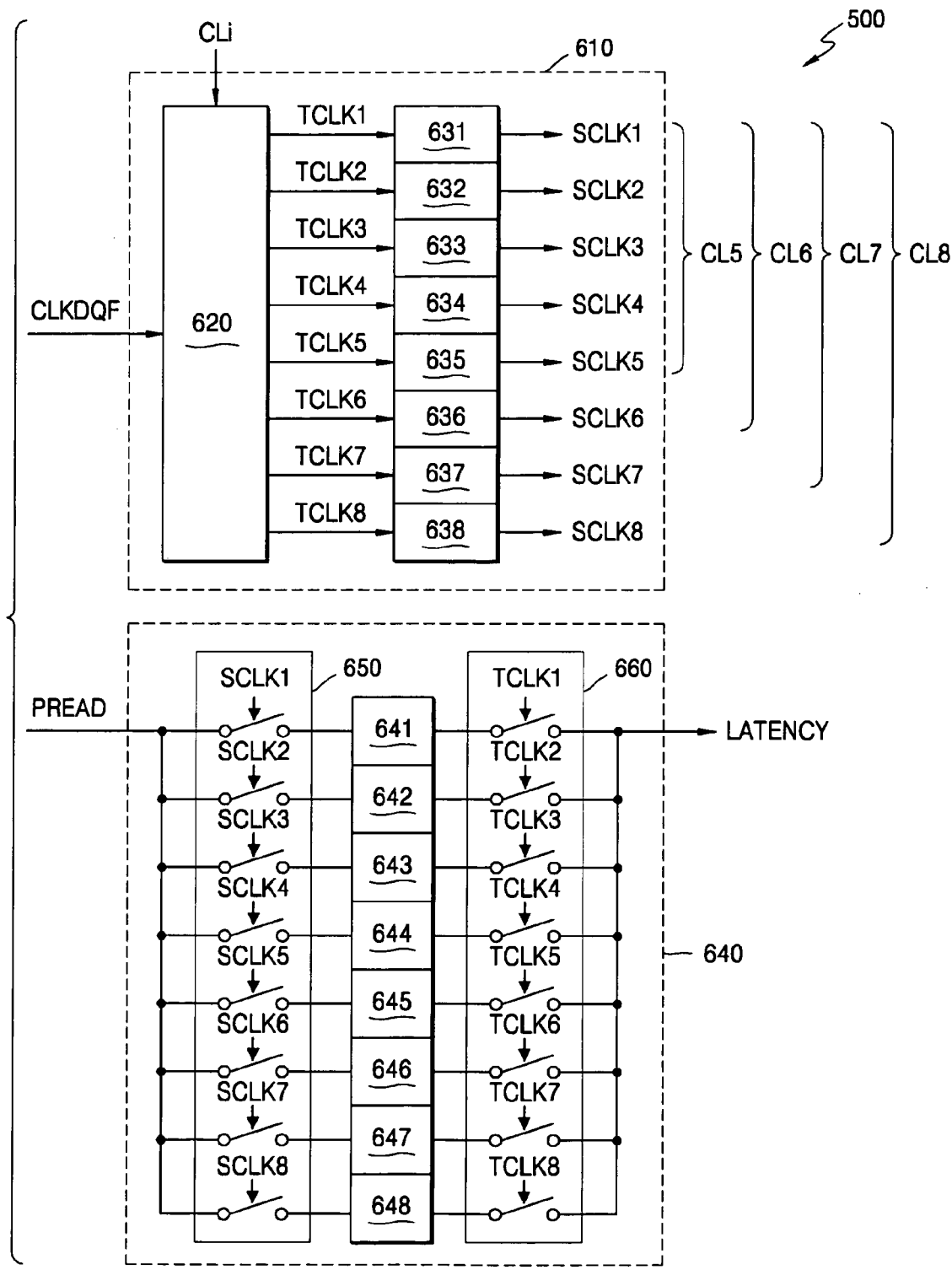
FIG. 20 is a block diagram illustrating another embodiment of a latency circuit according to the present invention.

FIG. 20 is a block diagram illustrating another embodiment of the latency circuit 500. However, as will be described below, this embodiment does not need to receive the internal clock signal PCLK. Namely, this latency circuit may also replace latency circuit 160 in FIG. 1. Referring to FIG. 20, the latency circuit 500 comprises a clock signal generating circuit 610 and a latency signal generator 640.

The clock signal generating circuit 610 includes a transfer signal generator 620 and first-eighth delay elements 631-638. The transfer signal generator 620 is illustrated in FIG. 21A.

Figure 21A:
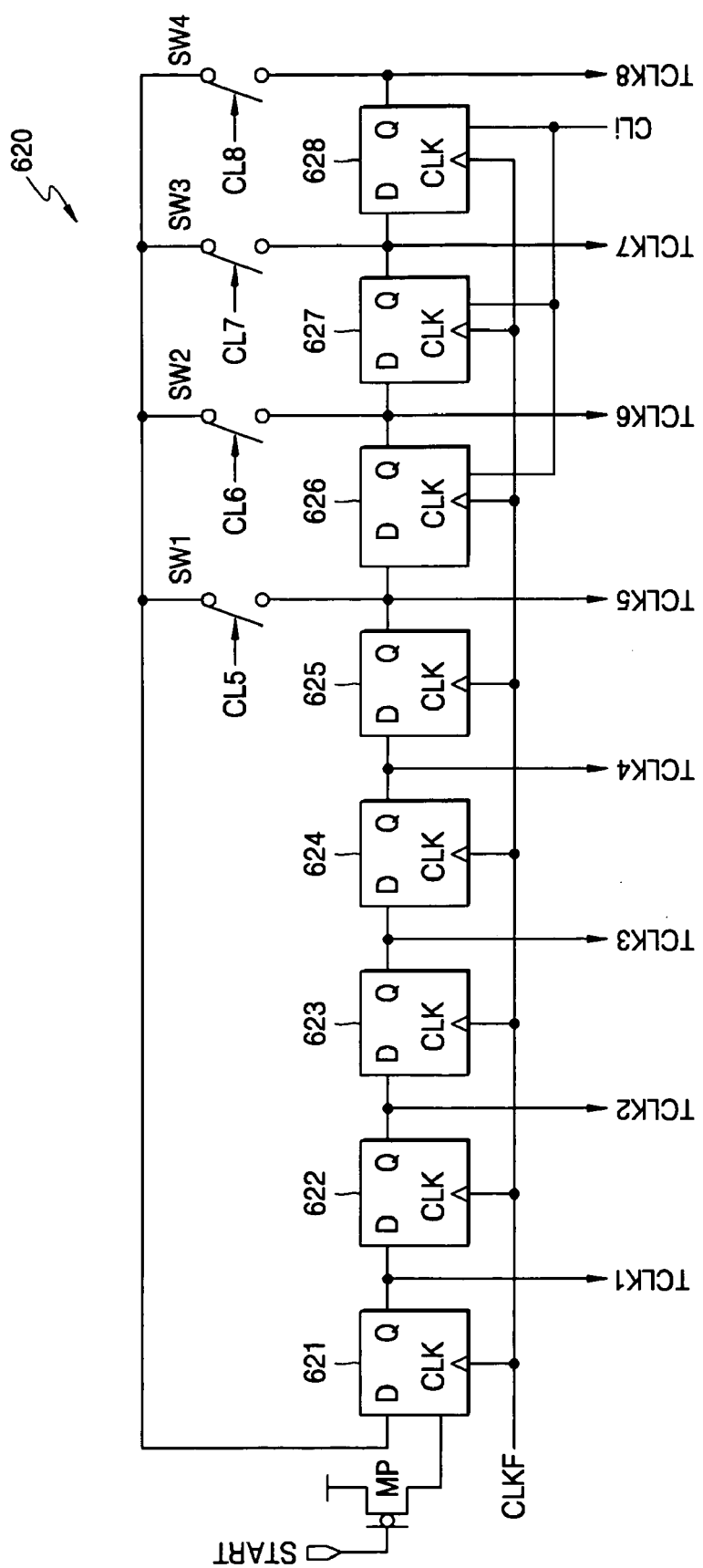
FIG. 21A is a circuit diagram illustrating an embodiment of the transfer signal generator shown in FIG. 20.

FIG. 21A is a circuit diagram illustrating an embodiment of the transfer signal generator 620 shown in FIG. 20. Referring to FIG. 21A, the transfer signal generator 620 includes first-eighth D-flip flops 621-628 connected in series or cascade. Outputs of the first-seventh D-flip flops 621-627 are respectively connected to inputs of the second-eighth D-flip flops 622-628. Clock inputs CLK of the first-eighth D-flip flops 621-628 receive the buffered clock signal CLKF output from the output buffer replica 124. The buffered clock signal CLKF has a frequency equal to a frequency of the data output clock signal CLKDQ generated by the DLL circuit 120 and a phase leading a phase of the data output clock signal CLKDQ.

A PMOS transistor MP is connected between a power supply voltage and the reset input of the first D-flop flop 621. The PMOS transistor MP receives a START signal at its gate and generates the reset-signal RESET. While not shown for the sake of brevity, the reset signal is also supplied to the reset inputs of the second-eighth D-flip flops 622-628. The first D-flip flop 621 is a settable D-flip flop and the second-eighth D-flip flops 622-628 are resettable D-flip flops. Accordingly, the first D-flip flop 621 is initialized as '1", and the second-eighth D-flip flops 622-628 are initialized as "0". The start signal START may be enabled after a period of time from the time when power is applied to a semiconductor memory device.

An output of the fifth D-flip flop 625 is connected to the input of the first D-flip flop 621 via a first switch SW1, an output of the sixth D-flip flop 626 is connected to the input of the first D-flip flop 621 via a second switch SW2, an output of the seventh D-flip flop 627 is connected to the input of the first D-flip flop 621 via a third switch SW3, and an output of the eighth D-flip flop 628 is connected to the input of the first D-flip flop 621 via a fourth switch SW4. The first-fourth switches SW1-SW4 are controlled by a respective CAS latency CLi. When the CAS latency is 5, the first switch SW1 is closed; when the CAS latency is 6, the second switch SW2 is closed; when the CAS latency is 7, the third switch SW3 is closed; and when the CAS latency is 8, the fourth switch SW4 is closed. While not shown for the sake of clarity, the sixth-eighth D-flip flops 626-628 may also be reset in response to the CAS latency CLi. To be more specific, when the CAS latency is 5, the sixth-eighth D-flip flops 626-628 are reset; when the CAS latency is 6, the seventh and eighth D-flip flops 627 and 628 are reset; and when the CAS latency is 7, the eighth D-flip flop 628 is reset. As such, the transfer signal generator may function as a ring shift register with each position of the ring shift register serving as a transfer signal; and wherein the switches form part of a control logic that selectively controls a length of the ring shift register.

Figure 21B:
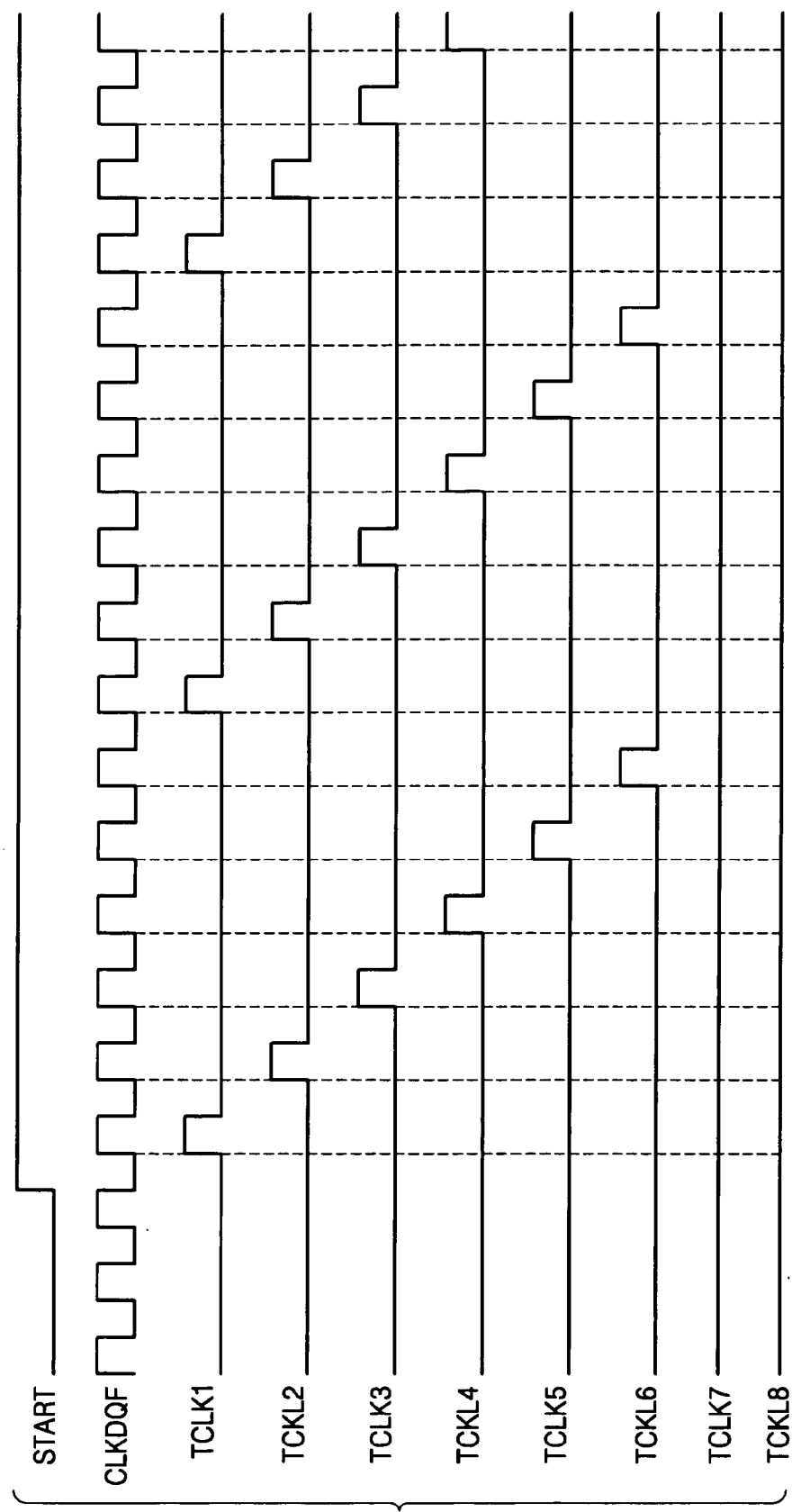
FIG. 21B illustrates the waveforms of the signals generated by or received by the transfer signal generator of FIG. 21A.

FIG. 21B illustrates the waveforms of the signals generated by or received by the transfer signal generator of FIG. 21A. Referring to FIGS. 21A and 21B, when the CAS latency is 6, the second switch SW2 is closed and the first, third, and fourth switches SW1, SW3, and SW4 are opened. The output of the sixth D-flip flop 626 is connected to the input of the first D-flip flop 621, and the seventh and eighth D-flip flops 627 and 628 are reset in response to the CAS CLi and are not substantially operated.

After the start signal START is enabled, a first transfer signal TCLK1 with a logic high level 1 is generated in synchronization with a rising edge of the buffered clock signal CLKF. The first transfer signal TCLK1 is transferred to the second-sixth D-flip flops 622-626 as pulses of the buffered clock signal CLKF are received. The first-sixth transfer signals TCLK1-TCLK6 have the same frequency and have pulses shifted by one clock cycle with respect to a preceding transfer signal pulse. A frequency of each of the first-sixth transfer signals TCLK1-TCLK6 is identical to a frequency given by dividing a frequency of the buffered clock signal CLKF (and therefore, the data output clock CLKDQ) by the CAS latency (herein, 6). Namely, the transfer signal generator 620 demultiplies the buffered clock signal CLKF by the CAS latency. Pulses of the first transfer signal TCLK1 are generated at 6 clock cycle intervals as shown in FIG. 21B. Pulses of the second-sixth transfer signals TCLK2-TCLK6 also have 6 clock cycle intervals like the first transfer signal TCLK1. As the CAS latency increases, the frequency of each of transfer signals TCLK1-TCLK6 decreases. As the CAS latency decreases, the frequency of each of transfer signals TCLK1-TCLK6 increases. The transfer signal generator 620 may generate the first-eighth transfer signals TCLK1-TCLK8 in response to the data output clock signal CLKDQ instead of the buffered clock signal CLKF. However, in this case, a data output margin may be decreased, which will be described later.

Referring back to FIG. 20, the first-eighth delay elements 631-638, respectively, delay the first-eighth transfer signals TCLK1-TCLK8 by a transfer sampling time tTS and generate the first-eighth sampling clock signals SCLK1-SCLK8, respectively. The transfer sampling time tTS may be 'tSAC+tREAD+tMG' in which tMG is a time of a delay in the latency circuit 500 or a sampling margin of the internal read signal PREAD for suitable operation of the latency circuit 500.

The latency signal generator 640 includes first switches 650, first-eighth latches 641-648, and second switches 660. The first switches 650 respectively store the internal read signal PREAD in the first-eighth latches 641-648, in response to respective ones of the first-eighth sampling clock signals SCLK1-SCLK8. The second switches 660 respectively output signals of the first-eighth latches 641-648 as the latency signal LATENCY in response to respective ones of the first-eighth transfer signals TCLK1-TCLK8.

Next, operation of the memory device according to FIG. 1, 4A, 4B or 4C and FIGS. 20-21A will be described with respect to FIGS. 22A-22T. FIGS. 22A-22T illustrate waveforms of the signals generated by or received by the memory device of FIG. 1, 4A, 4B or 4C having a latency circuit as illustrated in FIG. 20 when the CAS latency is 6. FIGS. 22A, 22C, 22E and 22S illustrate the external clock signal ECLK, internal clock signal PCLK, buffered clock signal CLKF and the data output clock CLKDQ, respectively. The pulses of the external clock signal ECLK, the buffered clock signal CLKF, the data output clock signal CLKDQ, and the internal clock signal PCLK have been labeled 1, 2, 3, etc. . . . in order to provide an understanding of correlations therebetween.

The internal clock generator 132 shown in FIG. 1 or 4A-4C generates an internal clock signal PCLK, and generates the internal read signal PREAD, as shown in FIG. 22D, in response to the internal clock signal PCLK and an external read command READ CMD, as shown in FIG. 22B. The internal read signal PREAD is internally enabled after tREAD from when the external read command READ CMD is synchronized with and input in a first clock cycle 1 of the external clock signal ECLK. The data output clock signal CLKDQ is generated by the DLL circuit 120 shown in FIGS. 1, 4A-4C. The buffered clock signal CLKF has a frequency equal to a frequency of the data output clock signal CLKDQ and a leading phase with respect to a phase of the data output clock signal CLKDQ. As described with reference to FIGS. 20-21B, the transfer signal generator 620 generates the first-sixth transfer signals TCLK1-TCLK6 in response to the buffered output clock signal CLKF. The first-sixth sampling clock signals SCLK1-SCLK6, that are delayed by a transfer sampling time tTS from the first-sixth transfer signals TCLK1-TCLK6, respectively, are generated by the clock signal generating circuit 610. FIGS. 22F-22K illustrate the first-sixth transfer signals TCLK1-TCLK6, FIGS. 22L-22Q illustrate the first-sixth sampling clock signals SCLK1-SCLK6, FIG. 22R illustrates the latency signal LATENCY, and FIG. 22T illustrates the output data DOUT from the data output buffer 140.

The internal read signal PREAD is latched by the first-sixth latches 641-646 shown in FIG. 20 in response to the first-sixth sampling clock signals SCLK1-SCLK6. In this case, the internal read signal PREAD at a high level is latched by a first and second latches 641 and 642 in response to the first and second sampling clock signals SCLK1 and SCLK2. The internal read signal PREAD at a low level is latched by other latches. The first-sixth latches 641-646 maintain previous data up to a next latch point by the first-sixth sampling clock signals SCLK1-SCLK6.

Data stored in the first-sixth latches 641-646 are generated as the latency signal LATENCY in response to the first-sixth transfer signals TCLK1-TCLK6, respectively. The latency signal LATENCY is enabled at a high level in response to the first and second transfer signals TCLK1 and TCLK2 and the latency signal LATENCY is disabled in a state of a low level in response to the third transfer signal TCLK3.

The output data DOUT is output in synchronization with the data output clock signal CLKDQ while the latency signal LATENCY is enabled in the state of the high level. The output data DOUT in synchronization with the data output clock signal CLKDQ is output to a bus after tSAC.

Output data D1 and D2 in synchronization with seventh and eighth clock cycles 7 and 8 of the data output clock signal CLKDQ are synchronized with seventh and eighth clock cycles 7 and 8 of the external clock signal ECLK and output to the bus. Since the valid output data DOUT is output in the seventh clock cycle 7 of the external clock signal ELCK in response to the external read command READ CMD which is input in the first clock cycle 1 of the external clock signal ELCK, the CAS latency is 6. Furthermore, as with previous embodiments, this embodiment is not limited to outputting the number of data words as described.

As shown in FIGS. 22A-22T, in order to output the output data D1 and D2 in response to the seventh and eighth clock cycles 7 and 8 of the data output clock signal CLKDQ, the latency signal may be active faster than the seventh clock cycle 7 of the data output clock signal CLKDQ. The transfer signal generator 620 may use the buffered clock signal CLKF that precedes the data output clock signal CLKDQ in a phase.

This embodiment of the present invention, with the latency circuit 500 comprising the eight D-flip flops 612-628 shown in FIG. 21A, the delay elements 631-638 and latches 641-648, supports a CAS latency of CL8 at a maximum. The latency circuit 500 may increase or decrease a maximum value of the CAS latency supported by the latency circuit 500 by increasing or decreasing the number of D-flip flops, delay elements, and latches. According to another embodiment of the present invention, the latency circuit 500 may adjust the CAS latency by adjusting the number and position of switches SW1-SW4 of the latency signal generator 620. For example, the CAS latency may be extended from 5~8 CL5-CL8 to 3~8 CL3-CL8 by adding a switch between the output of the third D-flip flop 623 and the input of the first D-flip flop 621 and a switch between the output of the second D-flip flop 622 and the input of the first D-flip flop 621.

As described above, like the latency circuits of previous embodiments, the latency circuit of this embodiment latches and stores the internal read signal PREAD using a plurality of sampling clock signals and generates the latched internal read signal PREAD as the latency signal LATENCY according to a desired output clock CLKDQ. Also, the number and pulse interval of sampling clock signals generated according to the CAS latency makes a difference in timing or relationship. Such a difference makes the number and pulse interval of transfer signals corresponding to each of sampling clock signals different.

Figure 23:
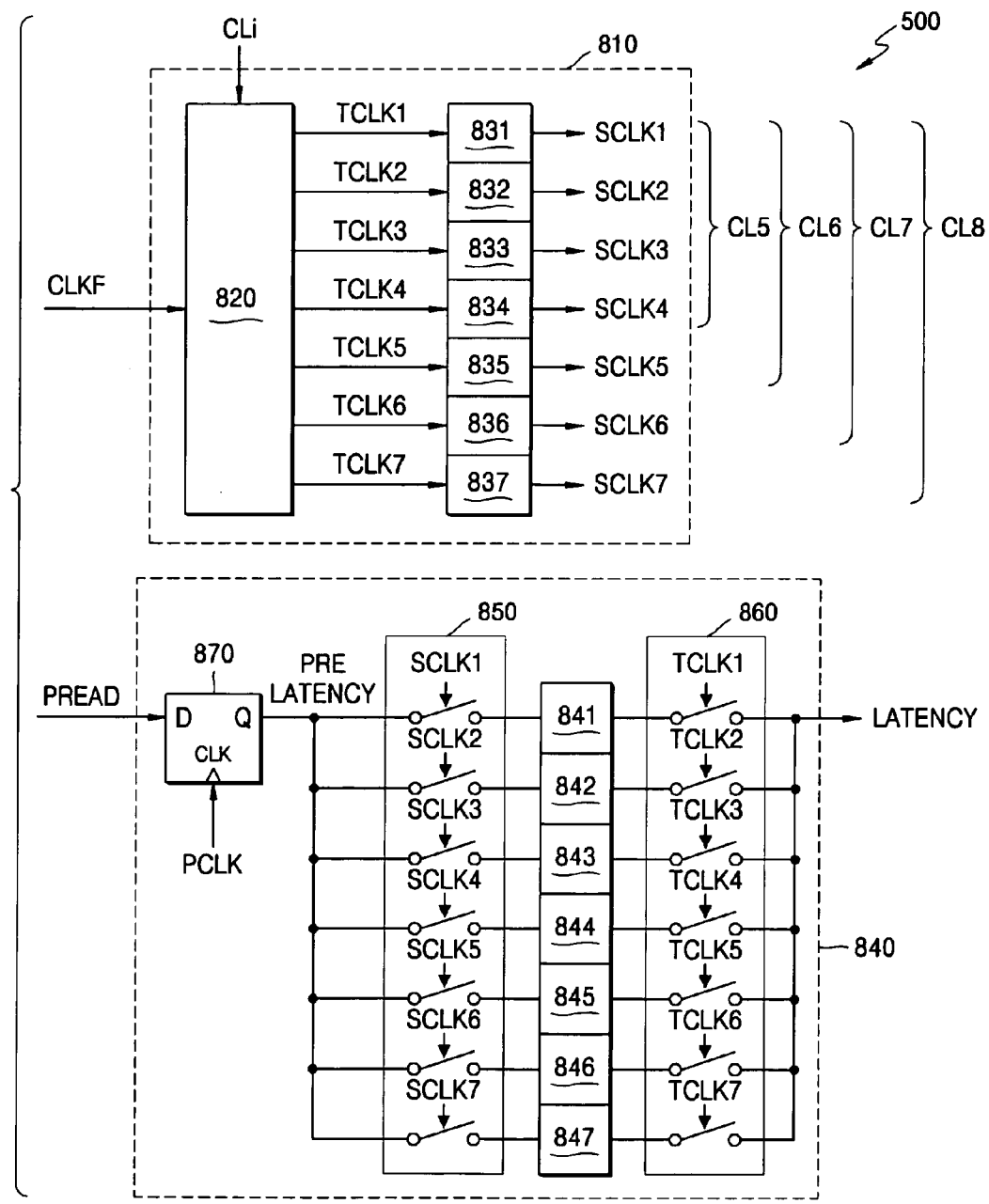
FIG. 23 is a block diagram illustrating a further embodiment of a latency circuit according to the present invention.

FIG. 23 is a block diagram illustrating a further embodiment of the latency circuit 500. Referring to FIG. 23, the latency circuit 500 comprises a clock signal generating circuit 810 and a latency signal generator 840. The clock signal generating circuit 810 includes seven delay elements 831-837 connected in parallel that respectively receive seven transfer signals TCLK1-TCLK7 that are output in parallel from a transfer signal generator 820, which will be described in detail below with respect to FIG. 24. The delay elements 831-837 each receive a respective transfer signal TCLK and output a respective one of the sampling clock signals SCLK1-SCLK7. The seven sampling clock signals SCLK1-SCLK7 respectively control first switches 850 of the latency signal generator 840, and the seven transfer signals TCLK1-TCLK7 respectively control second switches 860 of the latency signal generator 840.

The latency signal generator 840 comprises one flip flop circuit 870 that latches the internal read signal PREAD on the rising edge of the internal clock signal PCLK to produce a pre-latency signal. Seven first switches 850 are each connected to the flip flop circuit 870. First-seventh latches 841 through 847 latch the output from respective ones of the seven first switches 850, and seven second switches 860 are respectively connected to the outputs of the first-seventh latches 841-847. The output of the seven second switches 860 provides the latency signal LATENCY.

Figure 24:
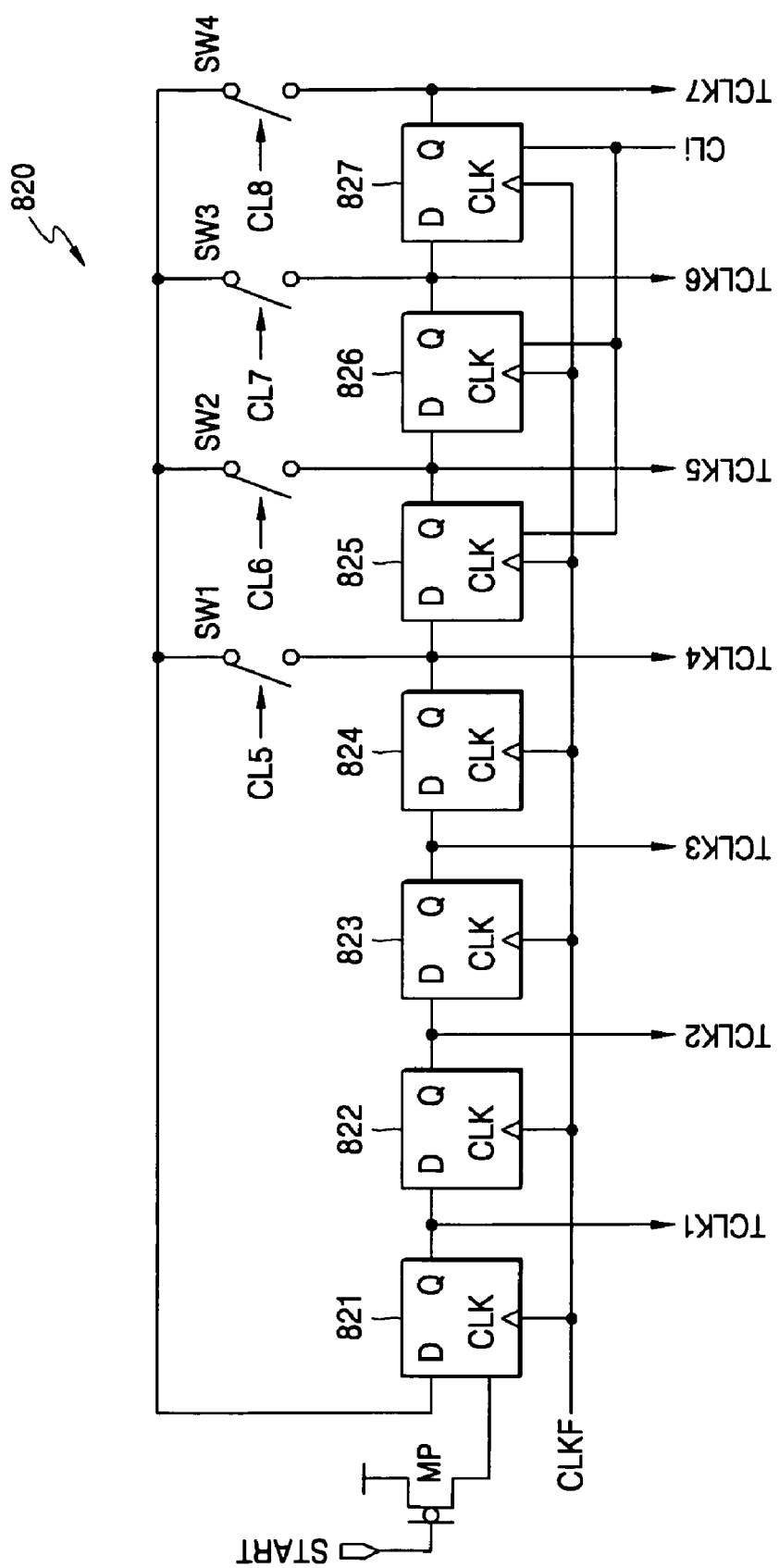
FIG. 24 is a circuit diagram illustrating an embodiment of a transfer signal generator shown in FIG. 23.

FIG. 24 is a circuit diagram illustrating the transfer signal generator 820 shown in FIG. 23. Referring to FIG. 24, the transfer signal generator 820 includes first-seventh D-flip flops 821-827 connected in series or cascade. Outputs of the first-sixth D-flip flops 821-826 are respectively connected to inputs of the second-seventh D-flip flops 822-827. Each clock input CLK of the first-seventh D-flip flops 821-827 receives the buffered clock signal CLKF. The buffered clock signal CLKF has a frequency equal to a frequency of the data output clock signal CLKDQ generated by the DLL circuit 120, and a phase leading a phase of the data output clock signal CLKDQ.

A PMOS transistor MP is connected between a power supply voltage and the reset input of the first D-flop flop 821. The PMOS transistor MP receives a START signal at its gate and generates the reset signal RESET. While not shown for the sake of brevity, the reset signal is also supplied to the reset inputs of the second-seventh D-flip flops 821-827. The first D-flip flop 821 is a settable D-flip flop and the second-seventh D-flip flops 822-827 are resettable D-flip flops. Accordingly, the first D-flip flop 821 is initialized as '1", and the second-seventh D-flip flops 822-827 are initialized as "0". The start signal START may be enabled after a period of time from the time when power is applied to a semiconductor memory device.

An output of the fourth D-flip flop 824 is connected to the input of the first D-flip flop 821 via a first switch SW1. An output of the fifth D-flip flop 825 is connected to the input of the first D-flip flop 821 via a second switch SW2, an output of the sixth D-flip flop 826 is connected to the input of the first D-flip flop 821 via a third switch SW3, and an output of the seventh D-flip flop 827 is connected to the input of the first D-flip flop 821 via a fourth switch SW4. The first-fourth switches SW1-SW4 are controlled by a respective CAS latency CLi. When the CAS latency is 5, the first switch SW1 is closed, when the CAS latency is 6, the second switch SW2 is closed; when the CAS latency is 7, the third switch SW3 is closed; and when the CAS latency is 8, the fourth switch SW4 is closed. While not shown for the sake of clarity, the fifth-seventh D-flip flops 825-827 may also be reset in response to the CAS latency CLi. To be more specific, when the CAS latency is 5, the fifth-seventh D-flip flops 825-827 are reset; when the CAS latency is 6, the sixth and seventh D-flip flops 826 and 827 are reset; and when the CAS latency is 7, the seventh D-flip flop 827 is reset. As such, the transfer signal generator may function as a right shift register with each position of the ring shift register serving as a transfer signal; and wherein the switches form part of a control logic that selectively controls a length of the ring shift register.

As stated above, the latency circuit 800 shown in FIG. 23 latches the internal read signal PREAD in a flip flop circuit 870 on the rising edge of the internal clock signal, and the timing relationship between the sampling clock signals and transfer clock signals control the gating or timing with which the output of the D-flip flop 870 becomes the latency signal LATENCY. Because of the involvement of the D-flip flop 870, the timing relationship of the sampling and transfer clock signals, as compared to the previous embodiments, is one less than the CAS latency (CLi−1). For example, when CL=5, while the latency circuit shown in FIG. 20 generates the transfer signals TCLK1-TCLK5, the latency circuit of FIG. 23 generates the transfer signals TCLK1-TCLK4. When CL=6, while the latency circuit of FIG. 20 generates the transfer signals TCLK1-TCLK6, the latency circuit of FIG. 23 generates the transfer signals TCLK1-TCLK5. When CL=7, while the latency circuit of FIG. 20 generates the transfer signals TCLK1-TCLK7, the latency circuit of FIG. 23 generates the transfer signals TCLK1-TCLK6. When CL=8, while the latency circuit of FIG. 20 generates the transfer signals TCLK1-TCLK8, the latency circuit of FIG. 23 generates the transfer signals TCLK1-TCLK7. Namely, the transfer signal generator 820 demultiplies the buffered clock signal CLKF by the CAS latency minus one.

Furthermore, it will be understood that more than one D-flip flop may be connected in series to delay the read signal PREAD and create the pre-latency signal PRE-LATENCY. For each additional D-flip flop, the number flip flops in the transfer signal generator, and therefore, the number of transfer signals is reduced. This also reduces the number of latches and switches in the clock signal generator 840. Also, it will be appreciated that the transfer signal generator 820 demultiplies the buffered clock signal CLKF by the CAS latency minus the number of flip flops delaying the read signal PREAD to create the signal PRE-LATENCY.

Next, operation of the memory device according to FIGS. 1, 4A, 4B or 4C and FIGS. 23-24 will be described with respect to FIGS. 25A-25S. FIGS. 25A-25S illustrate waveforms of the signals generated by or received by the memory device of FIG. 1, 4A, 4B or 4C having a latency circuit as illustrated in FIG. 23 when the CAS latency is 6. FIGS. 25A, 25C, 25F and 25R illustrate the external clock signal ECLK, internal clock signal PCLK, buffered clock signal CLKF, and the data output clock CLKDQ, respectively. The pulses of the external clock signal ECLK, the buffered clock signal CLKF, the data output clock signal CLKDQ, and the internal clock signal PCLK have been labeled 1, 2, 3, etc. . . . in order to provide an understanding of correlations therebetween.

The internal clock generator 132 shown in FIG. 1 or 4A-4C generates an internal clock signal PCLK, and generates the internal read signal PREAD as shown in FIG. 25D in response to the internal clock signal PCLK and an external read command READ CMD as shown in FIG. 25B. The internal read signal PREAD is internally enabled after tREAD from when the external read command READ CMD is synchronized with and input in a first clock cycle 1 of the external clock signal ECLK. The data output clock signal CLKDQ is generated by the DLL circuit 120 shown in FIGS. 1, 4A-4C. The buffered clock signal CLKF has a frequency equal to a frequency of the data output clock signal CLKDQ and a leading phase with respect to a phase of the data output clock signal CLKDQ. As described with reference to FIGS. 23-24, the transfer signal generator 820 generates the first-fifth transfer signals TCLK1-TCLK5 in response to the buffered output clock signal CLKF. The first-fifth sampling clock signals SCLK1-SCLK5, that are delayed by a transfer sampling time tTS from the first-fifth transfer signals TCLK1-TCLK6, respectively, are generated by the seven delay elements 831-837. FIGS. 25G-25K illustrate the first-fifth transfer signals TCLK1-TCLK5, FIGS. 25L-25P illustrate the first-fifth sampling clock signals SCLK1-SCLK5, FIG. 25Q illustrates the latency signal LATENCY, and FIG. 25S illustrates the output data DOUT from the data output buffer 140.

The internal read signal PREAD is latched by the D-flip flop 870 to generate the delayed version of the internal read signal called the pre-latency signal PRE-LATENCY. The pre-latency signal PRE-LATENCY is latched by the first-fifth latches 841-845 shown in FIG. 23 in response to the first-fifth sampling clock signals SCLK1-SCLK5. In this case, the pre-latency signal PRE-LATENCY at a high level is latched by the second and third latches 842 and 843 in response to the second and third sampling clock signals SCLK2 and SCLK3. The pre-latency signal PRE-LATENCY at a low level is latched by other latches. The first-fifth latches 841-845 maintain previous data up to a next latch point by the first-fifth sampling clock signals SCLK1-SCLK5.

Data stored in the first-fifth latches 841-845 are generated as the latency signal LATENCY in response to the first-fifth transfer signals TCLK1-TCLK5, respectively. The latency signal LATENCY is enabled at a high level in response to the second and third transfer signals TCLK2 and TCLK3 and the latency signal LATENCY is disabled in a state of a low level in response to the fourth transfer signal TCLK4.

The output data DOUT is output in synchronization with the data output clock signal CLKDQ while the latency signal LATENCY is enabled in the state of the high level. The output data DOUT in synchronization with the data output clock signal CLKDQ is output to a bus after tSAC.

Output data D1 and D2 in synchronization with seventh and eighth clock cycles 8 and 9 of the data output clock signal CLKDQ are synchronized with seventh and eighth clock cycles 7 and 8 of the external clock signal ECLK and output to the bus. Since the valid output data DOUT is output in the seventh clock cycle 7 of the external clock signal ELCK in response to the external read command READ CMD which is input in the first clock cycle 1 of the external clock signal ELCK, the CAS latency is 6. Furthermore, as with previous embodiments, this embodiment is not limited to outputting the number of data words as described.

This embodiment of the present invention supports a CAS latency of CL8 at a maximum. The latency circuit 500 may increase or decrease a maximum value of the CAS latency supported by the latency circuit 500 by increasing or decreasing the number of D-flip flops, delay elements, switches and latches. According to another embodiment of the present invention, the latency circuit 500 may adjust the CAS latency by adjusting the number and position of switches SW1-SW4 of the latency signal generator 820.

As described above, in the timing diagrams of FIGS. 25A-25S, the internal clock signal PCLK is latched to create the delayed read signal PRE-LATENCY. Like the latency circuits of previous embodiments, the latency circuit of this embodiment then latches and stores the delayed internal read signal PRE-LATENCY using a plurality of sampling clock signals and generates the latched delayed internal read signal PRE-LATENCY as the latency signal LATENCY at a desired output clock CLKDQ based on a plurality of transfer signals. Also, the number and pulse interval of sampling clock and transfer signals generated according to the CAS latency makes a difference in timing or relationship therebetween.

The invention can be modified in many ways. However, all such modifications obvious to one skilled in the art are not to be regarded as a departure from the spirit and scope of the invention, and are within the scope of the invention.

We claim:

1. A memory device, comprising:
   a memory cell array;
   an output buffer receiving data addressed from the memory cell array, and outputting the data in response to a latency signal;
   a latency circuit generating the latency signal based on CAS latency information and read information, the latency circuit including,
     a clock signal generating circuit generating a plurality of transfer signals, and generating a plurality of sampling clock signals based on and corresponding to the plurality of transfer signals such that a timing relationship is created between the transfer signals and the sampling clock signals, and
     a latency signal generator selectively storing the read information based on the sampling clock signals, and selectively outputting the stored read information as the latency signal based on the transfer signals.

2. The memory device of claim 1, wherein the clock signal generating circuit delays each one of the transfer signals by a transfer sampling time to generate a respective one of the sampling clock signals.

3. The memory device of claim 2, wherein the transfer sampling time is greater than or equal to a sum of a first time and a second time, the first time is a period of time to output the data from the output buffer, and the second time is a period of time to generate the read information.

4. The memory device of claim 2, wherein the clock signal generating circuit includes a transfer signal generating circuit that selectively generates a number of active transfer signals, the number being based on the CAS latency information.

5. The memory device of claim 4, wherein the number of active transfer signals equals a CAS latency indicated by the CAS latency information.

6. The memory device of claim 4, wherein the transfer signal generating circuit comprises:
   a ring shift register clocked by a clock signal, each position in the ring shift register serving as a transfer signal; and
   control logic cooperatively associated with the ring shift register and selectively controlling a length of a ring formed by the ring shift register to control the number of active transfer signals.

7. The memory device of claim 6, wherein the ring shift register includes one settable latch that latches a logic 1 upon receipt of reset signal, and at least one re-settable latch that latches a logic 0 upon receipt of the reset signal.

8. The memory device of claim 6, wherein the ring shift register includes series connected latches, and at least one of a second through last latch in the series is selectively re-settable based on the GAS latency information.

9. The memory device of claim 6, wherein the latency signal generator comprises:
   a plurality of latches;
   a plurality of first switches, each first switch corresponding to one of the plurality of latches and one of the plurality of sampling clock signals, each first switch receiving the read information and selectively storing the read information in the corresponding latch based on the corresponding sampling clock signal; and
   a plurality of second switches, each second switch corresponding to one of the plurality of latches and one of the plurality of transfer signals, each second switch selectively outputting the stored read information from the corresponding latch based on the corresponding transfer signal, the outputs of the plurality of second switches serving as the latency signal.

10. The memory device of claim 2, wherein the latency signal generator comprises:
    a plurality of latches;
    a plurality of first switches, each first switch corresponding to one of the plurality of latches and one of the plurality of sampling clock signals, each first switch receiving the read information and selectively storing the read information in the corresponding latch based on the corresponding sampling clock signal; and
    a plurality of second switches, each second switch corresponding to one of the plurality of latches and one of the plurality of transfer signals, each second switch selectively outputting the stored read information from the corresponding latch based on the corresponding transfer signal, the outputs of the plurality of second switches serving as the latency signal.

11. The memory device of claim 1, further comprising:
    an internal signal generator generating an internal signal based on an external signal, the internal signal having a same frequency as the external signal and offset from the external signal by a first period of time.

12. The memory device of claim 11, wherein the clock signal generating circuit generates the transfer signals by demultiplying the internal signal based on the CAS latency information.

13. The memory device of claim 12, wherein the first period of time is a period of time to output the data from the output buffer.

14. The memory device of claim 12, wherein the clock signal generating circuit delays each one of the transfer signals by a transfer sampling time to generate a respective one of the sampling clock signals, and the transfer sampling time is greater than or equal to a sum of the first period of time and a second period of time.

15. The memory device of claim 14, wherein the first period of time is a period of time to output the data from the output buffer, and the second period of time is a period of time to generate the read information.

16. The memory device of claim 1, wherein the latency signal generator comprises:
    a plurality of latches;
    a plurality of first switches, each first switch corresponding to one of the plurality of latches and one of the plurality of sampling clock signals, each first switch receiving the read information and selectively storing the read information in the corresponding latch based on the corresponding sampling clock signal; and
    a plurality of second switches, each second switch corresponding to one of the plurality of latches and one of the plurality of transfer signals, each second switch selectively outputting the stored read information from the corresponding latch based on the corresponding transfer signal, the outputs of the plurality of second switches serving as the latency signal.

17. The memory device of claim 1, wherein the latency signal generator delays the read information, selectively stores the delayed read information based on the sampling clock signals, and selectively outputs the stored, delayed read information as the latency signal based on the transfer signals.

18. The memory device of claim 17, wherein the latency signal generator comprises:
    one or more latches connected in series to receive the read information and generate the delayed read information.

19. The memory device of claim 17, wherein the latency signal generator comprises:
    one or more first latches connected in series to receive the read information and generate the delayed read information;
    a plurality of second latches;
    a plurality of first switches, each first switch corresponding to one of the plurality of second latches and one of the plurality of sampling clock signals, each first switch receiving the delayed read information and selectively storing the delayed read information in the corresponding second latch based on the corresponding sampling clock signal; and
    a plurality of second switches, each second switch corresponding to one of the plurality of second latches and one of the plurality of transfer signals, each second switch selectively outputting the stored, delayed read information from the corresponding second latch based on the corresponding transfer signal, the outputs of the plurality of second switches serving as the latency signal.

20. The memory device of claim 19, wherein the clock signal generating circuit delays each one of the transfer signals by a transfer signaling time to generate a respective one of the sampling clock signals.

21. The memory device of claim 20, wherein the transfer sampling time is greater than or equal to a sum of a first time and a second time, the first time is a period of time to output the data from the output buffer, and the second time is a period of time to generate the read information.

22. The memory device of claim 20, wherein the clock signal generating circuit includes a transfer signal generating circuit that selectively generates a number of active transfer signals, the number being based on the CAS latency information.

23. The memory device of claim 22, wherein the transfer signal generating circuit comprises:
a ring shift register clocked by a clock signal, each position in the ring shift register serving as a transfer signal; and
control logic cooperatively associated with the ring shift register and selectively controlling a length of a ring formed by the ring shift register to control the number of active transfer signals.

24. The memory device of claim 23, wherein the ring shift register includes one settable latch that latches a logic 1 upon receipt of reset signal, and at least one re-settable latch that latches a logic 0 upon receipt of the reset signal.

25. The memory device of claim 23, wherein the ring shift register includes series connected latches, and at least one of a second through last latch in the series is selectively re-settable based on the CAS latency information.

26. The memory device of claim 19, wherein the clock signal generating circuit generates the transfer signals and the sampling clock signals such that a period of the transfer signals and the sampling clock signals equals the period of an internal signal divided by a difference value, the difference value equal to a CAS latency indicated by the CAS latency information minus a number of the first latches.

27. The memory device of claim 26, further comprising:
an internal signal generator generating the internal signal based on an external signal, the internal signal having a same frequency as the external signal and offset from the external signal by a first period of time.

28. The memory device of claim 27, wherein the clock signal generating circuit generates the transfer signals by demultiplying the internal signal based on the CAS latency information.

29. The memory device of claim 27, wherein the first period of time is a period of time to output the data from the output buffer.

30. The memory device of claim 27, wherein the clock signal generating circuit delays each one of the transfer signals by a transfer sampling time to generate a respective one of the sampling clock signals, and the transfer sampling time is greater than or equal to a sum of the first period of time and a second period of time.

31. The memory device of claim 30, wherein the first period of time is a period of time to output the data from the output buffer, and the second period of time is a period of time to generate the read information.

32. A memory device, comprising:
a memory cell array;
an output buffer receiving data addressed from the memory cell array, and outputting the data in response to a latency signal;
a latency circuit generating a plurality of transfer signals and a plurality of sampling clock signals based on CAS latency information such that a timing relationship is created between the transfer signals and the sampling clock signals, delaying read information, selectively storing the delayed read information based on the sampling clock signals, and selectively outputting the stored, delayed read information as the latency signal based on the transfer signals.

33. The memory device of claim 32, wherein the latency circuit comprises:
one or more latches connected in series to receive the read information and generate the delayed read information.

34. The memory device of claim 32, wherein the latency circuit comprises:
one or more first latches connected in series to receive the read information and generate the delayed read information;
a plurality of second latches;
a plurality of first switches, each first switch corresponding to one of the plurality of second latches and one of the plurality of sampling clock signals, each first switch receiving the delayed read information and selectively storing the delayed read information in the corresponding second latch based on the corresponding sampling clock signal; and
a plurality of second switches, each second switch corresponding to one of the plurality of second latches and one of the plurality of transfer signals, each second switch selectively outputting the stored, delayed read information from the corresponding second latch based on the corresponding transfer signal, the outputs of the plurality of second switches serving as the latency signal.

35. The memory device of claim 34, wherein the latency circuit delays each one of the transfer signals by a transfer sampling time to generate a respective one of the sampling clock signals.

36. The memory device of claim 35, wherein the transfer sampling time is greater than or equal to a sum of a first time and a second time, the first time is a period of time to output the data from the output buffer, and the second time is a period of time to generate the read information.

37. The memory device of claim 35, wherein the clock signal generating circuit includes a transfer signal generating circuit that selectively generates a number of active transfer signals, the number being based on the CAS latency information.

38. The memory device of claim 37, wherein the transfer signal generating circuit comprises:
a ring shift register clocked by a clock signal, each position in the ring shift register serving as a transfer signal; and
control logic cooperatively associated with the ring shift register and selectively controlling a length of a ring formed by the ring shift register to control the number of active transfer signals.

39. The memory device of claim 38, wherein the ring shift register includes one settable latch that latches a logic 1 upon receipt of reset signal, and at least one re-settable latch that latches a logic 0 upon receipt of the reset signal.

40. The memory device of claim 38, wherein the ring shift register includes series connected latches, and at least one of a second through last latch in the series is selectively re-settable based on the GAS latency information.

41. The memory device of claim 34, wherein the latency circuit generates the transfer signals and the sampling clock signals such that a period of the transfer signals and the sampling clock signals equals the period of an internal signal divided by a difference value, the difference value equal to a GAS latency indicated by the GAS latency information minus a number of the first latches.

42. The memory device of claim 41, further comprising:
an internal signal generator generating an internal signal based on an external signal, the internal signal having a same frequency as the external signal and offset from the external signal by a first period of time.

43. The memory device of claim 42, wherein the clock signal generating circuit generates the transfer signals by demultiplying the internal signal based on the GAS latency information.

44. The memory device of claim 42, wherein the first period of time is a period of time to output the data from the output buffer.

45. The memory device of claim 42, wherein the clock signal generating circuit delays each one of the transfer signals by a transfer sampling time to generate a respective one of the sampling clock signals, and the transfer sampling time is greater than or equal to a sum of the first period of time and a second period of time.

46. The memory device of claim 45, wherein the first period of time is a period of time to output the data from the output buffer, and the second period of time is a period of time to generate the read information.

47. A latency circuit, comprising:
a clock signal generating circuit generating a plurality of transfer signals, and generating a plurality of sampling clock signals based on and corresponding to the plurality of transfer signals such that a timing relationship is created between the transfer signals and the sampling clock signals, and
a latency signal generator selectively storing read information based on the sampling clock signals, and selectively outputting the stored read information as a latency signal based on the transfer signals.

48. A latency circuit, comprising:
one or more first latches connected in series to receive read information and generate delayed read information;
a plurality of second latches;
a plurality of first switches, each first switch corresponding to one of the plurality of second latches and one of a plurality of sampling clock signals, each first switch receiving the delayed read information and selectively storing the delayed read information in the corresponding second latch based on the corresponding sampling clock signal; and
a plurality of second switches, each second switch corresponding to one of the plurality of second latches and one of a plurality of transfer signals, each second switch selectively outputting the stored, delayed read information from the corresponding second latch based on the corresponding transfer signal, the outputs of the plurality of second switches serving as a latency signal.

49. A method of controlling output from a memory device, comprising:
storing data for output in a buffer;
outputting data from the buffer based on a latency signal;
generating a plurality of transfer signals based on GAS latency information;
generating a plurality of sampling clock signals based on and corresponding to the plurality of transfer signals such that a timing relationship is created between the transfer signals and the sampling clock signals;
selectively storing read information based on the sampling clock signals; and
selectively outputting the stored read information as the latency signal based on the transfer signals.

50. The method of claim 49, further comprising:
delaying the read information; and wherein
the selectively storing step stores the delay read information; and
the selectively outputting step selectively outputs the stored, delayed read information.

* * * * *